(12) United States Patent
Mirkin et al.

(10) Patent No.: US 10,203,598 B2
(45) Date of Patent: Feb. 12, 2019

(54) GRADIENT SPRAY COATING POLYMER PEN ARRAYS

(71) Applicant: NORTHWESTERN UNIVERSITY, Evanston, IL (US)

(72) Inventors: Chad A. Mirkin, Wilmette, IL (US); Keith A. Brown, Newton, MA (US); James L. Hedrick, III, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/295,914

(22) Filed: Oct. 17, 2016

(65) Prior Publication Data

US 2017/0108772 A1 Apr. 20, 2017

Related U.S. Application Data

(60) Provisional application No. 62/242,379, filed on Oct. 16, 2015.

(51) Int. Cl.
*G03F 7/00* (2006.01)
*B05D 5/06* (2006.01)

(52) U.S. Cl.
CPC .......... *G03F 7/0002* (2013.01); *B05D 5/061* (2013.01); *B05D 2490/60* (2013.01)

(58) Field of Classification Search
None
See application file for complete search history.

(56) References Cited

U.S. PATENT DOCUMENTS

| 5,472,881 A | 12/1995 | Beebe et al. |
| 5,776,748 A | 7/1998 | Singhvi et al. |

(Continued)

FOREIGN PATENT DOCUMENTS

| WO | WO-99/48682 A1 | 9/1999 |
| WO | WO-2010/096593 A2 | 8/2010 |

OTHER PUBLICATIONS

Allara et al., Spontaneously organized molecular assemblies. 1. Formation, dynamics and physical properties of n-Alkanoic acids adsorbed from solution on an oxidized aluminum surface, Langmuir, 1: 45 (1985).

(Continued)

*Primary Examiner* — Michael P. Rodriguez
(74) *Attorney, Agent, or Firm* — Marshall, Gerstein & Borun LLP

(57) ABSTRACT

The disclosure provides a method of inking a polymer pen lithography tip array ("PPL tip array"), including applying an ink composition to a PPL tip array using at least two spray applicators to deposit the ink as a non-uniform ink layer. The disclosure further provides a method of depositing at least two ink compositions on PPL tip array, including applying a first ink to a first defined area using a first spray applicator, and applying a second ink to a second defined area using a second spray applicator. The disclosure further provides a method of scaling a linear ink composition gradient provided by at least two spray applicators to a PPL tip array having a length, L, including positioning the spray applicators at a distance of about 5.0 L to about 8.0 L relative to the surface of the PPL tip array, positioning the spray applicators at a distance of about 0.5 L to about 3.0 L relative to each other, and applying an ink composition.

20 Claims, 6 Drawing Sheets

(56) References Cited

U.S. PATENT DOCUMENTS

| | | | |
|---|---|---|---|
| 5,908,692 | A | 6/1999 | Hamers et al. |
| 5,942,397 | A | 8/1999 | Tarlov et al. |
| 6,500,549 | B1 | 12/2002 | Deppisch et al. |
| 6,596,346 | B2 | 7/2003 | Bernard et al. |
| 2004/0228962 | A1 | 11/2004 | Liu et al. |
| 2005/0035983 | A1* | 2/2005 | Cruchon-Dupeyrat ................ B82Y 10/00 346/140.1 |

OTHER PUBLICATIONS

Allara et al., The study of the gas-solid interaction of acetic acid with a cuprous oxide surface using reflection-absorption spectroscopy, J. Colloid Interface Sci., 49: 410-21 (1974).
Anwander et al., Surface characterization and functionalization of MCM-41 silicas via silazane silylation, J. Phys. Chem. B, 104:3532-44 (2000).
Bain, A new class of self-assembled monolayers: organic thiols on gallium arsenide, Adv. Mater., 4:591-4 (1992).
Bansal et al., Electrochemical properties of (111)-oriented n-Si surfaces derivatized with covalently-attached alkyl chains, J. Phys. Chem. B, 102:1067-70 (1998).
Bernard et al., Printing patterns of proteins, Langmuir, 14:2225-9 (1998).
Bishop et al., Self-assembled monolayers: Recent developments and applications, Curr. Opin. Colloid & Interface Sci., 1:127-36 (1996).
Brazdil et al. Resonance raman spectra of adsorbed species at solid-gas interfaces. 2. Y-Nitrosodimethylaniline and Y-Dimethylamino-azobenzene adsorbed on semiconductor oxide surfaces, J. Phys. Chem., 85, 1005-14 (1981).
Burwell Modified silica gels as adsorbents and catalysts, Chemical Technology, 4, 370-7 (1974).
Calvert, Lithographic patterning of self-assembled films, J. Vac. Sci. Technol. B, 11:2155 (1993).
Chang et al., Structures of self-assembled monolayers of aromatic-derivatized thiols on evaporated gold and silver surfaces: implication on packing mechanism, J. Am. Chem. Soc., 116, 6792-805 (1994).
Chen et al., Do alkanethiols adsorb onto the surfaces of Tl—Ba—Ca—Cu—O-based high-temperature superconductors? The critical role of H20 content on the adsorption process, Langmuir, 12:2622-4 (1996).
Chen et al., Surveying the surface coordination chemistry of a superconductor: spontaneous adsorption of monolayer films of redox-active ligands on $YBa_2$—$Cu_3O_7$-σ, J. Am. Chem. Soc., 117:6374-5 (1995).
Chen et al., Synthesis and characterization of carboxylate-modified gold nanoparticle powders dispersible in water, Langmuir, 15:1075-82 (1999).
Chidsey, Book of Abstracts, 214th ACS National Meeting, Las Vegas, Nev., Sep. 7-11, 1997, I&EC-027.
Dai et al., Topographically directed self-assembly of goldnanoparticles, J. Mater. Chem., 21:16863-5 (2011).
Dammel, Diazonaphthoquinone Based Resists, 1st ed., SPIE Optical Engineering Press, Bellingham, Wash. (1993).
Donzel et al., Hydrophilic Poly(dimethylsiloxane) Stamps for Microcontact Printing, Adv. Mater., 13(15):1164-7 (2001).
Dubois et al., Synthesis, structure, and properties of model organic surfaces, Phys. Chem., 43:437-63 (1992).
Ellison et al., Adsorption of Phenyl Isothiocyanate on Si(001): A 1,2-Dipolar Surface Addition Reaction, J. Phys. Chem. B, 103:6243-51 (1999).
Ellison et al., Cycloaddition Chemistry on Silicon(001) Surfaces: The Adsorption of Azo-tert-butane, J. Phys. Chem. B, 102:8510-8 (1998).
Eltekova et al., Adsorption of aromatic compounds from solutions on titanium dioxide and silica, Langmuir, 3:951-7 (1987).

Fenter et al., Structure of CH3(CH2)17SH self-assembled on the Ag(111) surface: an incommensurate monolayer, Langmuir, 7, 2013-16 (1991).
Grabar et al., Preparation and characterization of Au colloid monolayers, Anal Chem, 67 : 735-43 (1995).
Gu et al., Electron tunneling at the semiconductor-insulator-electrolyte interface. Photocurrent studies of the n-InP-alkanethiol-ferrocyanide system, J. Phys. Chem. B, 102:9015-28 (1998).
Gui et al., Adsorption and surface structural chemistry of thiophenol, benzyl mercaptan, and alkyl mercaptans. Comparative studies at Ag(111) and Pt(111) electrodes by means of auger spectroscopy, electron energy loss spectroscopy, low-energy election diffraction, and electrochemistry, Langmuir, 7, 955-63 (1991).
Hamers et al., Formation of Ordered, Anisotropic Organic Monolayers on the Si(001) Surface, J. Phys. Chem. B, 101:1489-92 (1997).
He et al, Preparation of Hydrophilic Poly(dimethylsiloxane) Stamps by Plasma-Induced Grafting, Langmuir, 19(17):6982-6 (2003).
Henderson et al., Self-assembled monolayers of ithiols, diisocyanides, and isocyanothiols on gold: chemically sticky surfaces for covalent attachment of metal clusters and studies of interfacial electron transfer, Inorg. Chim. Acta, 242:115-24 (1996).
Hickman et al., Combining spontaneous molecular assembly with microfabrication to pattern surfaces: selective binding of isonitriles to platinum microwires and characterization by electrochemistry and surface spectroscopy, J. Am. Chem. Soc., 111: 7271-7272 (1989).
Hickman et al., Toward orthogonal self-assembly of redox active molecules on Pt and Au: selective reaction of disulfide with Au and isocyanide with Pt, Langmuir, 8, 357-9 (1992).
Hovis et al., Cycloaddition chemistry and formation of ordered organic monolayers on silicon (001) surfaces, Surf. Sci., 402-404:1-7 (1998).
Hovis et al., Cycloaddition Chemistry of 1,3-Dienes on the Silicon(001) Surface: Competition between [4 + 2] and [2 + 2] Reactions, J. Phys. Chem. B, 102:6873-9 (1998).
Hovis et al., Structure and bonding of ordered organic monolayers of 1,5-cyclooctadiene on the silicon(001) surface, J. Phys. Chem. B, 101:9581-5 (1997).
Hubbard, Electrochemistry of well-defined surfaces, Acc. Chem. Res., 13:177-84 (1980).
Huc et al., Self-assembled mono- and multilayers on gold from 1,4-diisocyanobenzene and ruthenium phthalocyanine, J. Phys. Chem. B, 103: 10489-95 (1999).
Huo et al., Polymer pen lithography, Science, 321(5896):1658-60 (2008).
Iler, The Chemistry of Silica, Chapter 6, New York: Wiley (1979).
James et al., Patterned protein layers on solid substrates by thin stamp microcontact printing, Langmuir, 14, 741-4 (1998).
Laibinis et al., f-Terminated alkanethiolate monolayers on surfaces of copper, silver, and gold have similar wettabilities, J. Am. Chem. Soc., 114, 1990-5 (1992).
Laibinis et al., Comparisons of self-assembled monolayers on silver and gold: mixed monolayers derived from HS(CH2)21X and HS(CH2)10Y (X, Y = CH3, CH2OH) have similar properties, Langmuir, 7:3167-73 (1991).
Lee et al., Adsorption of ordered zirconium phosphonate multilayer films on silicon and gold surfaces, J. Phys. Chem., 92 : 2597-601 (1988).
Li et al., Self assembly of n-Alkanethiolate monolayers on silver nano-structures: determination of the apparent thickness of the monolayer by scanning tunneling microscopy, Office of Naval Research, Technical Report No. 2, 24 pp (1994).
Li et al., Self-Assembly of n-Alkanethiolate Monolayers on Silver Nanostructures: Determination of the Apparent Thickness of the Monolayer by Scanning Tunneling Microscopy, J. Phys. Chem., 98(45): 11751-5 (1994).
Lo et al., Polypyrrole growth on YBa2Cu3O7-L modified with a self-assembled monolayer of N-(3-aminopropyl)pyrrole: hardwiring the electroactive hot spots on a superconductor electrode, J. Am. Chem. Soc., 118:11295-6 (1996).
Lunt et al., Chemical studies of the passivation of GaAs surface recombination using sulfides and thiols, J. Appl. Phys., 70:7449-67 (1991).

(56) References Cited

OTHER PUBLICATIONS

Lunt et al., Passivation of GaAs surface recombination with organic thiols, J. Vacuum Sci. Technol. B, 9:2333-6 (1991).
Magallon et al., Structural characterization of n-alkyl amine monolayers on copper by ellipsometry and infrared spectroscopy, IN: Book of Abstracts of 215th ACS National Meeting, Dallas, Texas, Mar. 29-Apr. 2, 1998, Abstract No. 048.
Maoz et al., Penetration-controlled reactions in organized monolayer assemblies. 1. Aqueous permanganate interaction with monolayer and multilayer films of long-chain surfactants, Langmuir, 3:1034-44 (1987).
Maoz et al., Penetration-controlled reactions in organized monolayers assemblies. 2. Aqueous permanganate interaction with self-assembling monolayers of long-chain surfactants, Langmuir, 3:1045-51 (1987).
Martin et al., Direct protein microarray fabrication using a hydrogel stamper, Langmuir, 14(15):3971-5 (1998).
Matteucci et al., Synthesis of deoxyoligonucleotides on a polymer support, J Am Chem Soc, 103:3185-91 (1981).
Mayya et al., A study of the partitioning of colloidal particles based on their size during electrostatic immobilization at the air-water interface using fatty amine monolayers, J. Phys. Chem. B, 101, 9790-3 (1997).
Menzel et al., Surface-confined nanoparticles as substrates for photopolymerizable self-assembled monolayers, Adv. Mater., 11:131-4 (1999).
Meyer et al., Evidence for adduct formation at the semiconductor-gas interface. Photoluminescent properties of cadmium selenide in the presence of amines, J. Am. Chem. Soc., 110: 4914-18 (1988).
Mirkin et al., Controlling the surface properties of high temperature superconductors, Adv. Mater., 9:167-73 (1997).
Mucic et al., Synthesis and characterization of DNA with ferrocenyl groups attached to their 5-termini: electrochemical characterization of a redox-active nucleotide monolayer, Chem Commun, 555-557 (1996).
Nakagawa et al., GaAs interfaces with octadecyl thiol self-assembled monolayer: structural and electrical properties, Japan J. Appl. Phys. Part I, 30:3759-62 (1991).
Nuzzo et al., Spontaneously organized molecular assemblies. 3. Preparation and properties of solution adsorbed monolayers of organic disulfides on gold surfaces, J Am Chem Soc, 109:2358-2368 (1987).
Ohno et al., Nanostructural formation of self-assembled monolayer films on cleaved AlGaAs/GaAs heterojuctions, Mol. Crystal Liq. Crystal Sci. Technol. A, 295:189-92 (1997).
Patil et al., Surface derivatization of colloidal silver particles using interdigitized bilayers: a novel strategy for electrostatic immobilization of colloidal particles in thermally evaporated fatty acid/fatty amine films, Langmuir, 14, 2707-11 (1998).
Pereira et al., Modification of surface properties of alumina by plasma treatment, J. Mater. Chem., 10, 259-61 (2000).
Pham et al., Spray coating of photoresist for pattern transfer on high topography surfaces, J. Micromechanics and Microengineering, 15(4):691-7 (2005).
Porter et al., Gold and silver nanoparticles functionalized by the adsorption of dialkyl disulfides, Langmuir, 14, 7378-86 (1998).
Reuter et al., Effects of gallium arsenide passivation on scanning tunneling microscope excited luminescence, IN: Mater. Res. Soc. Symposium Proceedings, 380:119-24 (1995).
Sangiorgi et al., Adsorption of 1-decylamine on copper, Gazz. Chim. Ital., 111: 99-102 (1981).
Sastry et al., Langmuir-Blodgett Films of Carboxylic Acid Derivatized Silver Colloidal Particles:? Role of Subphase pH on Degree of Cluster Incorporation, J. Phys. Chem. B, 101(25):4954-8 (1997).
Schmid et al., Siloxane Polymers for High-Resolution, High-Accuracy Soft Lithography, 33(8):3042-9 (2000).
Sheen et al., A new class of organized self-assembled monolayers: alkane thiols on GaAs, J. Am. Chem. Soc., 114:1514-15 (1992).
Slavov et al., Mechanism of silation of silica with hexamethyldisilazane, J. Phys. Chem. B, 104:983-9 (2000).
Solomun et al., On the promoting effect of alkali metals on the adsorption of nitriles on the gold(100) surface, Ber. Bunsen-Ges. Phys. Chem., 95:95-8 (1991).
Solomun et al., The interaction of nitriles with a potassium-promoted gold(100) surface, J. Phys. Chem., 95:10041-9 (1991).
Son et al., Adsorption of 4-methoxybenzyl cyanide on silver and gold surfaces investigated by fourier transform infrared spectroscopy, J. Phys. Chem., 98:8488-93 (1994).
Song, Quenching of porous silicon photoluminescence by aromatic molecules, and surface derivatization of porous silicon with dimethyl sulfoxide, aryllithium, or alkyllithium reagents, Doctor of Philosophy in ChemistryThesis, University of California at San Diego (1998).
Soriaga et al., Determination of the orientation of aromatic molecules adsorbed on platinum electrodes. The effect of solute concentration, J Am Chem Soc, 104:3937-45 (1982).
Steiner et al., Adsorption of alkanenitriles and alkanedinitriles on gold and copper, Langmuir, 8, 2771-7 (1992).
Steiner et al., Adsorption of NPh3, PPh3, AsPh3, SbPh3, and BiPh3 on gold and copper, Langmuir, 8, 90-4 (1992).
Tao, Structural comparison of self-assembled monolayers of n-alkanoic acids on the surfaces of silver, copper, and aluminum, J. Am. Chem. Soc., 115:4350-8 (1993).
Timmons et al., Investigation of fatty acid monolayers on metals by contact potential measurements, J Phys Chem, 69:984-990 (1965).
Ulman, An Introduction to Ultrathin Organic Films: From Langmuir-Blodgett to Self-Assembly, Boston: Academic Press (1991).
Ulman, Formation and Structure of Self-Assembled Monolayers, Chem. Rev., 96:1533-54 (1996).
Walczak et al., Structure and interfacial properties of spontaneously adsorbed n-alkanethiolate monolayers on evaporated silver surfaces, J. Am. Chem. Soc., 113:2370-8 (1991).
Wang et al., Scanning Probe Contact Printing, Langmuir, 19(21):8951-5 (2003).
Wasserman et al., Structure and reactivity of alkylsiloxane monolayers formed by reaction of alkyltrichlorosilanes on silicon substrates, Langmuir, 5:1074-1087 (1989).
Whitesides, Proceedings of the Robert A. Welch Foundation 39th Conference on Chemical Research Nanophase Chemistry, Houston, Texas, pp. 109-21 (1995).
Xia et al., Soft Lithography, Angew. Chem. Int. Ed., 37:550-75 (1998).
Xu et al., Surface coordination chemistry of YBa2Cu3O7-L, Langmuir, 14:6505-11 (1998).
Yamamoto et al., Characterization of the surface to thiol bonding in self-assembled monolayer films of C12H25SH on InP (100) by angle-resolved X-ray photoelectron spectroscopy, Langmuir, 15:8640-4 (1999).
Yonezawa et al., Layered nanocomposite of close-packed gold nanoparticles and TiO2 gel layers, Chem. Mater., 11:33-5 (1999).
Zhang et al., Dip Pen Nanolithography Stamp Tip, Nano Lett., 4(9):1649-55 (2004).
Zheng et al., Multiplexed protein arrays enabled by polymer pen lithography: addressing the inking challenge, Angew. Chem. Int. Ed. Engl., 48(41):7626-9 (2009).

\* cited by examiner

| Source | An Them Intensity | Pd Cathion Intensity | Detected Au/In | Detected Pd/In | Atomic % Au | Atomic % Pd |
|---|---|---|---|---|---|---|
| Pd +6 mm | 5491 | 41835 | 3011 | 29618 | 9 | 91 |
| Pd +3 mm | 9186 | 11042 | 5038 | 7817 | 39 | 61 |
| Au +3 mm | 63229 | 24553 | 34676 | 17363 | 66 | 33 |
| Au +6 mm | 102503 | 11042 | 56214 | 7817 | 88 | 12 |
| Au +9 mm | 27661 | 4785 | 15170 | 3388 | 82 | 18 |

GRADIENT SPRAY COATING POLYMER PEN ARRAYS

CROSS REFERENCE TO RELATED APPLICATION

The benefit under 35 U.S.C. § 119(e) of U.S. Provisional Patent Application No. 62/242,379, filed Oct. 16, 2015, is hereby claimed and the entire disclosure is incorporated herein by reference.

STATEMENT OF GOVERNMENT SUPPORT

This invention was made with government support under FA9550-12-1-0141 and FA9550-12-1-0280 awarded by the Air Force Office of Scientific Research. The government has certain rights in the invention.

FIELD OF THE DISCLOSURE

The disclosure relates generally to polymer pen lithography arrays having a non-uniform ink layer. More specifically, the disclosure relates to polymer pen lithography arrays having an ink gradient layered thereon and dual spray-coating methods of providing polymer pen lithography arrays having an ink gradient layered thereon.

BACKGROUND

The nanomaterial landscape is so vast that a combinatorial approach is required to understand the underlying structure-function relationships, which presents a challenge for chemical synthesis. High throughput screening is an invaluable tool for scientific discovery in many fields. A key technology that enables these high throughput approaches is the ability to synthesize combinatorial libraries of compounds and reaction conditions that allow for the study of a variety of samples in unison. As such, combinatorial libraries have been utilized in diverse fields including catalysis, drug discovery, and basic cell biology. At current, such massively parallel experiments are typically performed using advanced liquid handling systems that deposit nanoliter scale fluid volumes into plates with as many as 1536 distinct wells. However, the path to utilizing smaller volumes and higher throughput faces major challenges as techniques for depositing controlled quantities of chemically specific materials in a high throughput manner are very limited. Ink jet printing, both through electrohydrodynamic jetting and ultrasonic focusing, can in some cases generate sub femptoliter-scale volumes, but is limited in throughput by serial printing afforded by a single nozzle and low registration accuracy owing to the dewetting process. Similarly, the direct write of materials from a physical scanning probe, or dip-pen nanolithography, can reliably pattern sub-attoliter volumes, but throughput is a critical limitation.

Recently, it has been recognized that by using a massive array of polymeric probes on a rigid backing layer is a path to overcoming the challenge by providing as many as 11 million probes that can operate in synchrony, the challenge from the perspective of using these for constructing combinatorial libraries is generating unique chemical features with each pen in the array. A major avenue of research has been to exploit the unique cantilever-free architecture in ways that transform the lithographic capabilities. For instance, due to the large coefficient of thermal expansion inherent to elastomers, local heating can be used to independently address specific probes. Furthermore, due the amount of material deposited is related to the tip-sample pressure due to the compliant nature of the pens. This fact has been exploited by deliberately tilting the pen array with respect to a surface, it is possible to pattern a centimeter-scale array of features wherein the feature size varies continuously across the array.

Chemical heterogeneity has proven more difficult to systematically introduce as currently the only methods that have been explored has been by inking tips in blocks using micro-contact printing or individually inking them using ink jet printing. While these present an advantage in terms of scaling, one ink jet printing operation is needed to ink a single pen with ~50 micron pitch which will subsequently be used to pattern thousands of features with submicron pitch, it is still not practical for scaling to millions of pens. Indeed, for many types of experiments, independent control over every pen in the array is unnecessary because what is needed is a continuously varying gradient in composition. From this perspective, advances in how to rapidly ink polymer pen arrays with non-uniform ink composition would bear important implications for the synthesis of combinatorial arrays for rapid materials discovery.

SUMMARY

One aspect of the disclosure provides a method of inking a polymer pen lithography tip array ("PPL tip array"), including applying an ink composition to a defined area of the PPL tip array using at least two spray applicators to deposit the ink composition as a non-uniform ink layer onto the PPL tip array.

Another aspect of the disclosure provides a method of depositing at least two ink compositions on a polymer pen lithography tip array ("PPL tip array"), including applying a first ink composition to a first defined area of the PPL tip array using a first spray applicator, and applying a second ink composition to a second defined area of the PPL tip array using a second spray applicator, thereby providing a mixture of ink compositions on the PPL tip array.

Another aspect of the disclosure provides a method of scaling a linear ink composition gradient provided by at least two spray applicators to a polymer pen lithography tip array ("PPL tip array") having a length, L, including positioning the at least two spray applicators at a distance of about 5.0 L to about 8.0 L relative to the surface of the PPL tip array, positioning the at least two spray applicators at a distance of about 0.5 L to about 3.0 L relative to each other, and applying an ink composition to the PPL tip array from the at least two spray applicators.

Further aspects and advantages will be apparent to those of ordinary skill in the art from a review of the following detailed description. While the methods are susceptible of embodiments in various forms, the description hereafter includes specific embodiments with the understanding that the disclosure is illustrative and is not intended to limit the invention to the specific embodiments described herein.

DETAILED DESCRIPTION

Figure 1:
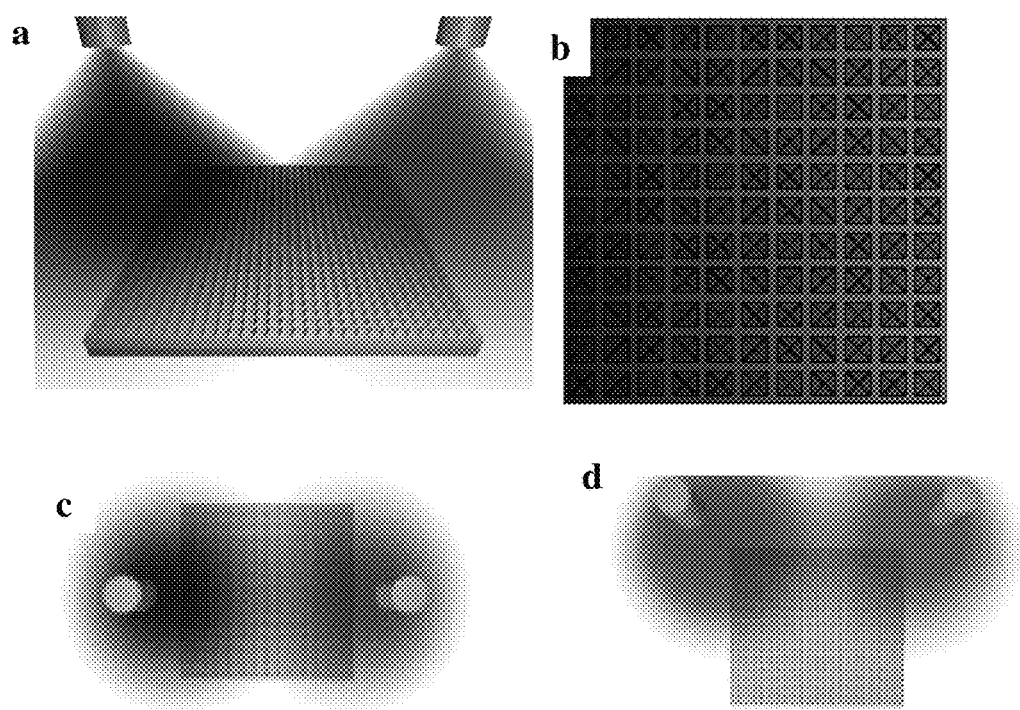
FIG. 1 shows (a) side view of dual spray-coating method to create a gradient of ink on the surface of the pen array, (b) top view down view of the pen array after spraying, (c) a top view of dual spray-coating method to create a compositional gradient of ink on the surface of the pen array, and (d) top view of alternative positioning of spray applicators to create a compositional gradient of ink on the surface of the pen array and a size (quantity) gradient of ink on the surface of the pen array.
Figure 2:
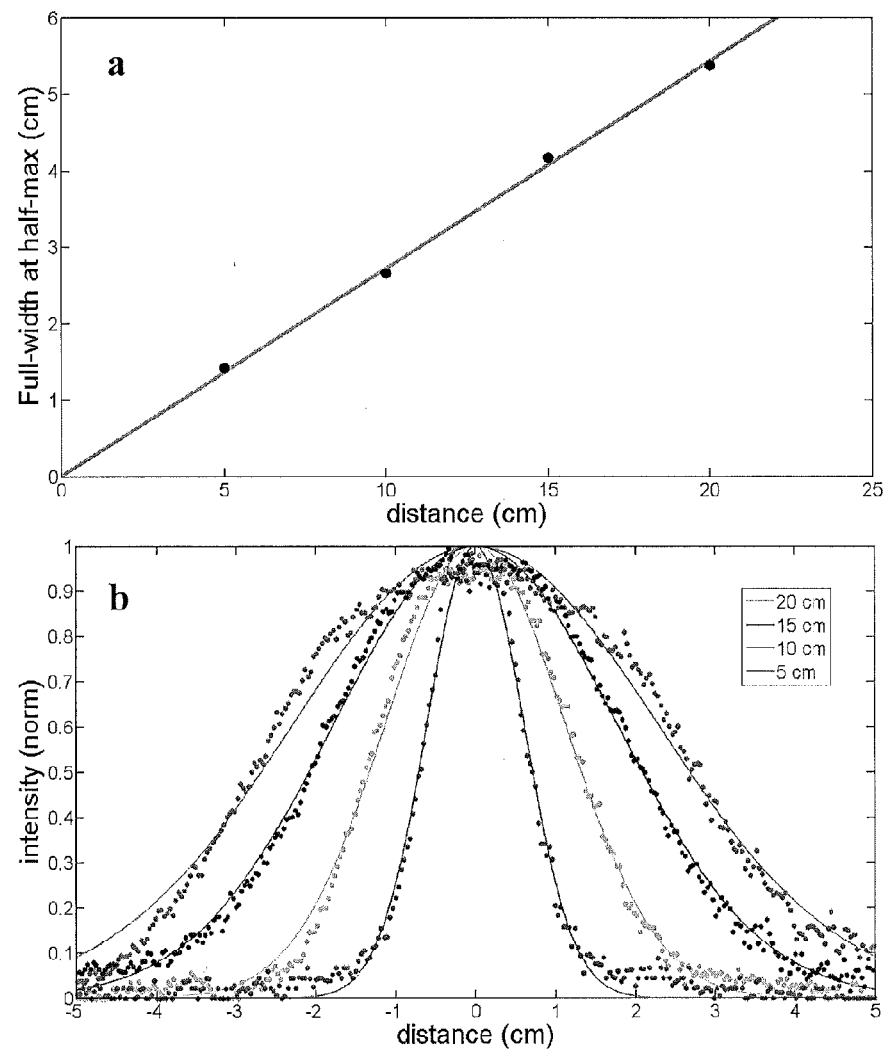
FIG. 2 shows (a) full width half max as a function of distance based on scanned spray coated sheets of paper, and (b) intensity curve fits from scanned spray deposition onto paper from different distances.

Provided herein are methods for inking polymer pen arrays with a gradient of ink composition using a dual-spray coating procedure. In some aspects, the methods include inking a polymer pen lithography tip array ("PPL tip array") using at least two spray applicators to deposit at least one ink composition to a defined area of the PPL tip array to provide a non-uniform ink layer on the PPL tip array. Optionally, the non-uniform ink layer comprises a concentration gradient of an ink composition. Optionally, the non-uniform ink layer comprises a compositional gradient of two or more ink compositions applied by the at least two spray applicators. In embodiments, the gradient comprises a linear gradient, a non-linear gradient, or combinations thereof. Optionally, a uniform quantity of ink can be applied across the PPL tip array or a non-uniform quantity of ink can be applied across the PPL tip array. In embodiments, the non-uniform ink layer can include a compositional gradient of two or more ink compositions across a first dimension of the PPL array and an ink quantity gradient across a second dimension of the PPL array.

In some aspects, the method includes depositing at least two ink compositions on a PPL tip array including applying a first ink composition to a first defined area of the PPL tip array using a first spray applicator, applying a second ink composition to a second defined area of the PPL tip array using a second spray applicator, thereby providing a mixture of ink compositions on the PPL tip array. Optionally, the mixture of ink compositions on the PPL tip array comprises a non-uniform ink layer. In embodiments, the non-uniform ink layer includes a compositional gradient. In embodiments, the gradient comprises a linear gradient, a non-linear gradient, or combinations thereof. Optionally, the mixture of ink compositions provides a uniform quantity of ink across the array. Alternatively, in embodiments, the mixture of ink compositions provides a non-uniform quantity of ink across the array. In embodiments, the first composition and the second composition are applied concurrently. In alternate embodiments, the first composition and the second composition are applied step-wise. In embodiments, the non-uniform ink layer includes a compositional gradient of the first and second ink compositions across a first dimension of the PPL array and an ink quantity gradient across a second dimension of the PPL array.

In some aspects, the method includes scaling a linear ink compositional gradient provided by at least two spray applicators to a PPL tip array having a length, L, including positioning the at least two spray applicators at a distance of about 5.0 L to about 8.0 L relative to the surface of the PPL tip array, positioning the at least two spray applicators at a distance of about 0.5 L to about 3.0 L relative to each other, and applying an ink composition to the PPL tip array from the at least two spray applicators. Optionally, the applying step provides a compositional gradient that varies from about 15% to about 85% over the length, L, of the PPL tip array.

The methods disclosed herein provide one or more advantages, for example, providing an array having a different but deliberate quantity and composition of ink, allowing generation nanoscale features with controllable size and composition.

While inking polymer pen arrays may be a new task, the process of coating materials with uniform thin films is a widely used industrial process encompassing methods include spin coating, dip coating, and spray coating. The advantages and drawbacks of these techniques are well known; spin coating is compatible with high viscosity inks but is limited to relatively small surfaces while spray coating requires relatively low viscosity solutions but is extremely scalable. However, both of these methods are typically optimized to generate uniform films. Here, the radial distribution of spray-coated ink is investigated and the possibility of using multiple spray coating nozzles (spray applicators) with overlapping distribution areas as a method for inking pen arrays with a compositional gradient is explored. Importantly, by combining a compositional gradient in one dimension with a size (quantity) distribution in the other, centimeter-scale surfaces coated with a combinatorial array of sub micrometer soft materials are prepared.

As used herein, a "non-uniform layer" or "non-uniform ink layer" refers to an ink layer that has a different concentration of an ink across a length of the PPL tip array, a different composition of ink across a length of the PPL tip array (e.g., is a chemically heterogeneous composition across a length of the PPL tip array), a different quantity of ink provided across a length of the PPL tip array, or combinations of the foregoing.

In embodiments, the non-uniform layer may include a different concentration of ink across a length of the PPL tip array, such as a concentration gradient wherein a maximum concentration of an ink component is present at an edge of the PPL tip array and decreases across the array to a minimum concentration at an opposite edge of the PPL tip array. A concentration gradient may be prepared by, for example, spraying a first ink composition from a first spray applicator and spraying the corresponding ink solvent from a second spray applicator, wherein the spray applicators have overlapping distribution areas (e.g., as shown in FIG. 1a), thereby providing uniform quantities across the PPL tip array but different ink concentrations across the PPL tip array.

Similarly, a compositional gradient may be prepared using a dual spray-applicator system wherein the spray applicators have overlapping distribution areas and a first spray applicator provides a first ink composition and a second spray applicator provides a second ink composition, thereby providing uniform quantities across the PPL tip array but different ink compositions across the PPL tip array. In particular, one patterning composition is coated at one side of the tip array and a second patterning composition is coated at the other side of the tip array such that the compositional gradient includes a major fraction of a first ink composition at one edge of a PPL tip array, with the concentration of the first ink composition decreasing across the length, L, (e.g., the x-axis) of the PPL tip array, and a major fraction of a second ink composition at an opposite edge of a PPL tip array, with the concentration of the second ink composition decreasing across the length, L, of the PPL tip array, such that a 50/50 composition of the first ink composition and second ink composition is provided in a center region of the PPL tip array (e.g., as shown in FIG. 1c and FIG. 9a). The result will be opposing concentration gradients of the two patterning compositions along the tip array. Additional patterning compositions can be coated on the PPL tip array, to arrive at gradient patterning compositions of three, four, five, or six different compositions, for example.

A linear gradient refers to a gradient wherein the change to the composition between successive tips is constant across the tip array. For example, the concentration of a first ink may decrease linearly across the tip array (such that the slope of the change in concentration over change in distance from the array edge is the same for each tip) while the concentration of a second ink may increase linearly across the tip array. A non-linear gradient refers to a gradient wherein the change to the composition between successive tips is not constant across the tip array. For example, the concentration of an ink may decrease more rapidly between tips that are further from the ink-originating edge (lower concentration) of the array than between tips that are closer to ink-originating edge (higher concentration) of the array.

In embodiments, a first ink composition is applied to a first defined area of the PPL tip array and a second ink composition is applied to a second defined area of the PPL tip array. In embodiments, the first defined area and the second defined area are separate. In embodiments, the first defined area and the second defined area overlap. In embodiments, the first defined area includes an edge of the PPL tip array and the second defined area includes an opposite edge of the PPL tip array.

Figure 6:
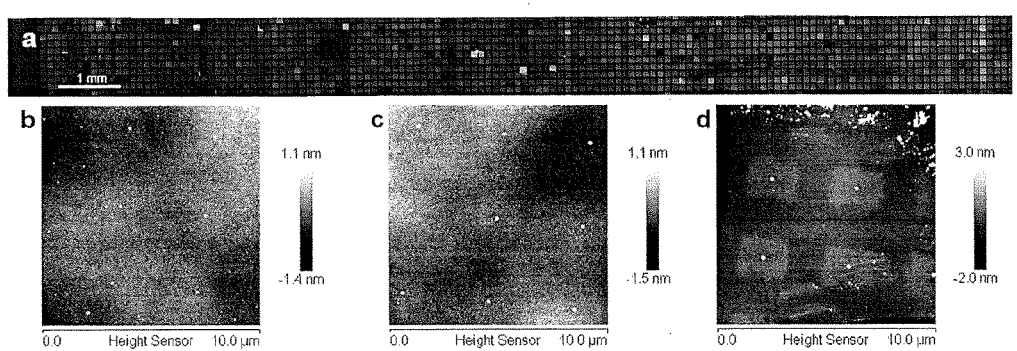
FIG. 6 shows (a) fluorescent image of a printed pattern generated by printing with a pen array sprayed only on the right side with 20 mM Rhodamine 6G. AFM images show the varying size of written features as they increase from the (b) left, (c) middle, and (d) right.

A PPL tip array may be prepared such that the quantity of the ink is non-uniform across a PPL tip array in combination with an ink concentration gradient or ink composition gradient. A uniform quantity is provided if the total volume of the ink or inks provided is the same at each tip of the array. A non-uniform quantity is provided if the total volume of the ink or inks provided is variable between tips of the array. By varying the quantity of ink applied to a PPL tip array as a means to change the rate of ink deposition from the PPL tip array to a substrate, the corresponding size of the features of a patterned substrate provided by the PPL tip array may be varied. In order to explore the concept, a single spray gun was used to deposit a gradient of ink quantity by spraying an aqueous solution of 5 mg/ml P2VP-b-PEO and 10 mg/ml rhodamine 6G onto one edge of a polymer pen array (FIG. 6). Prior to patterning, the pen array and patterning instrument was held at 100% relative humidity (RH) for 30 min to ensure that the ink was hydrated. Subsequently, the array was used to print a 25×25 array of dot features on a silicon wafer that had been vapor coated with hexamethyldisilazane to render it hydrophobic. Given that this pen array contained 126×126 pens, the final pattern was composed of nearly 10 million discrete polymer features which were characterized by large scale fluorescence imaging (FIG. 6a), which revealed a clear gradient in fluorescence intensity across the array. The intensity variation was based upon a change in deposited feature size, a conclusion supported by measurements of the average feature size by atomic force microscopy (AFM) performed at different regions across the array (FIG. 6b-d). Indeed, the average polymer feature size was observed to increase from 190 nm to 290 nm from the left to right side of the deposited pattern. It is important to note that while similar linear gradients have been previously achieved by patterning with pen arrays that have been deliberately not perfectly leveled, controlling feature size with ink loading affords the option of realizing non-linear and even non-monotonic gradients in patterned feature size.

As described in detail below, the PPL tip array includes tips having a base portion fixed to a tip substrate layer. The shape of the PPL tip array is determined by the shape of the tip substrate layer. The tip substrate layer may be of any suitable shape. Non-limiting examples of tip substrate layer shapes are quadrilaterals such as squares and rectangles. When the tip substrate layer is a quadrilateral, the PPL tip array has at least one dimension, L, across which a concentration gradient or a compositional gradient may be formed on the surface of the array. In embodiments, a non-uniform layer may include a concentration or composition gradient across a first dimension of the PPL array (i.e., the L dimension) and an ink quantity gradient across a second dimension of the PPL array (e.g., perpendicular to the first dimension).

Bridging the gap between two revolutionary technologies through the combination of combinatorial libraries and soft lithography yields the creation of a nano soft material screening platform. Dual spray coating technique is performed to create both size (quantity) and compositional gradients across polymer pen lithography arrays in a continuous format utilizing small linear window at the edge of the spray deposition area. Through evaporative self-assembly, this macro scale process creates a micro scale continuous gradient between each polymer pen tips across the array through diffusion and then drying onto the base and walls of the pyramidal tip, which then prints nano scale features. Nano combinatorial libraries of gold palladium bimetallic nanoparticles are created through scanning probe block copolymer lithography using a dual spray deposition onto polymer pen lithography array. Demonstrating a platform for creating complex nano arrays with an elegant simplicity for nano combinatorial screening. Characterization of size gradients was performed atomic force microscopy demonstrating a size increase, and compositional gradients with fluorescent intensity for fluorophores and x-ray fluorescence for bimetallic nanoparticle composition demonstrating a composition gradient from 9% to 88% between the two species.

Figure 3:
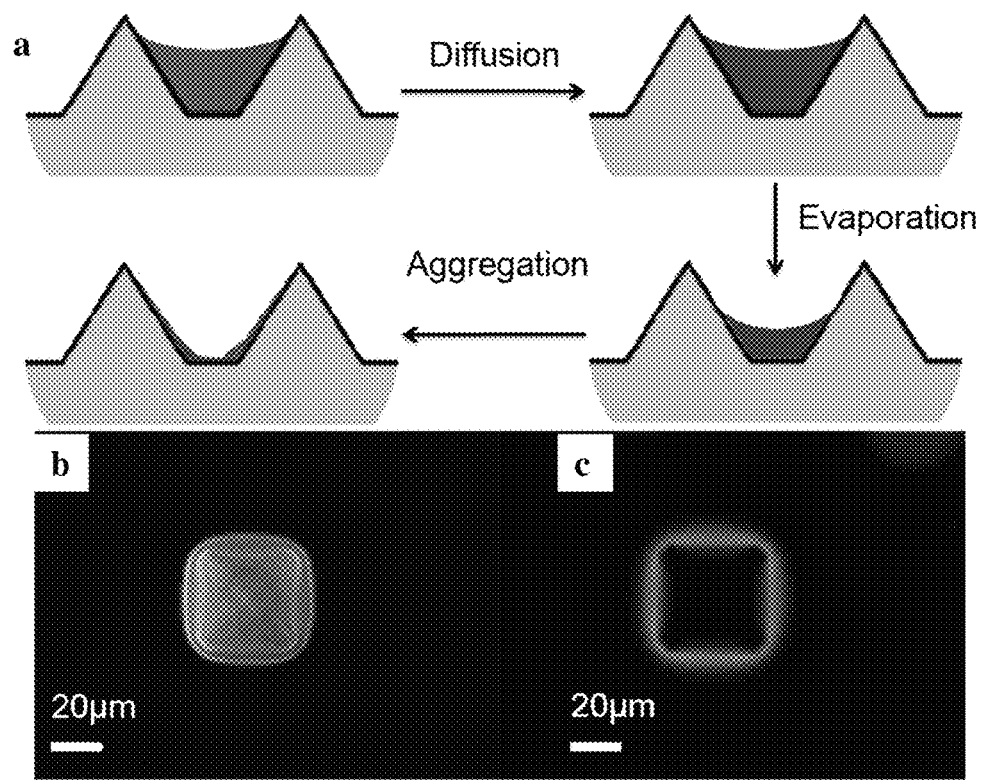
FIG. 3 shows (a) proposed mechanism of ink evaporation following spray coating in which evaporation and diffusion leads to homogenous mixing of the inks and preferential deposition of the ink on the pens. Optical image of a single pen under (b) dark field and (c) fluorescence showing preferential inking at the base of the pen.

In embodiments wherein at a first ink composition and a second ink composition are deposited on a PPL tip array using a first spray applicator and a second spray applicator, the first ink composition and second ink composition may be applied concurrently or step-wise. In embodiments, the first and second ink compositions are provided concurrently to allow diffusion and mixing of the two inks to provide homogeneous inks at each tip of the PPL tip array. Forming a compositional gradient on a surface decorated with a periodic array of pyramidal tips could introduce problems stemming from inhomogeneous drying or diffusion of the constituent materials. Considering a small molecule with a diffusion constant $D \sim 3.5 \times 10^{-6}$ cm$^2$/s, one may compute the time over which molecules of interest will diffuse between pens and across the whole array. In particular, for 1.5 cm width pen array with a pen to pen pitch of 120 µm, the molecule will diffuse between pens in ~20 s and across the whole array in ~400 days, predicting an extremely long window over which drying can occur and not even out the compositional gradient. It is hypothesized that allowing for enough time for diffusion to occur around a specific pen may be important as it could allow for diffusive mixing of the multicomponent ink sprayed near a given pen (FIG. 3a). In order to test this, two aqueous inks were synthesized, both consisting of 5 mg/ml P2VP-b-PEO and 10 mg/ml of a fluorophore (Rhodamine 6G and Alexa Fluor 647). The peak emission wavelengths of the two fluorphores were different (i.e. one at 566 nm and the other at 647 nm), such that under a fluorescence microscope the inks would be distinguishable without fluorescent overlap. A typical inking procedure consisted of simultaneously spraying the two inks, each aimed at different edges of the polymer pen array. The solutions were then allowed to completely dry and the process was repeated a total of three times to ensure uniformity of the gradient across the array. Once the array was completely dried, optical microscopy was used to characterize the ink distribution in the vicinity of the pens. Specifically, by observing a pen in the center of the array, such that it was exposed to both inks being sprayed, dark field (FIG. 3b) and fluorescence (FIG. 3c) microscopy revealed a uniform ring of ink around a pen, suggesting both uniform mixing and that capillary effects during drying result in the ink being localized around the pen.

Figure 4:
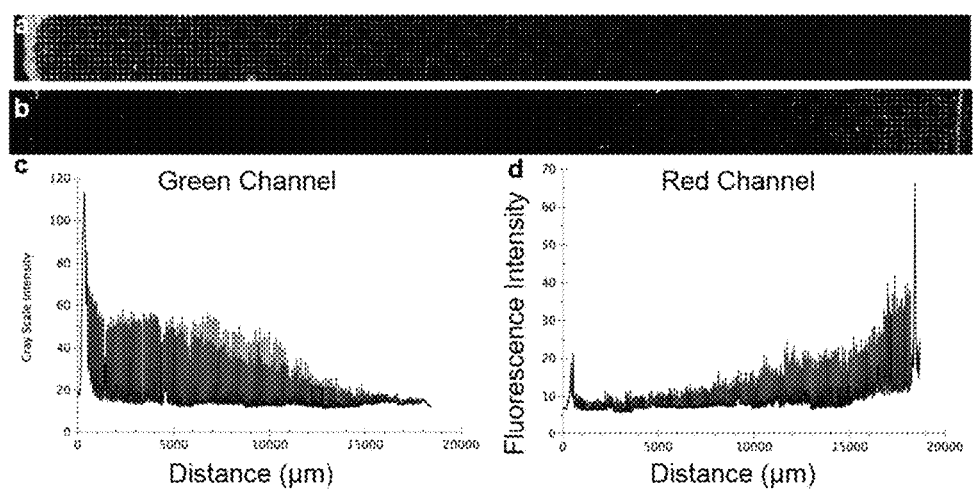
FIG. 4 shows direct observation of a compositional gradient from spray-coating. Here, a pen array was inked by spraying 490 nm emission quantum dots in an aqueous solution with P2VP-b-PEO sprayed on the left edge with and 575 nm emission quantum dots sprayed from the right edge. Fluorescence images reveal the distribution of quantum dots in the blue (a) and red (b) channels. (c) Profile of fluorescence intensity from (a), and (d) profile of fluorescence intensity of (b). Counter-propagating gradient of red and blue intensity is clear.
Figure 5:
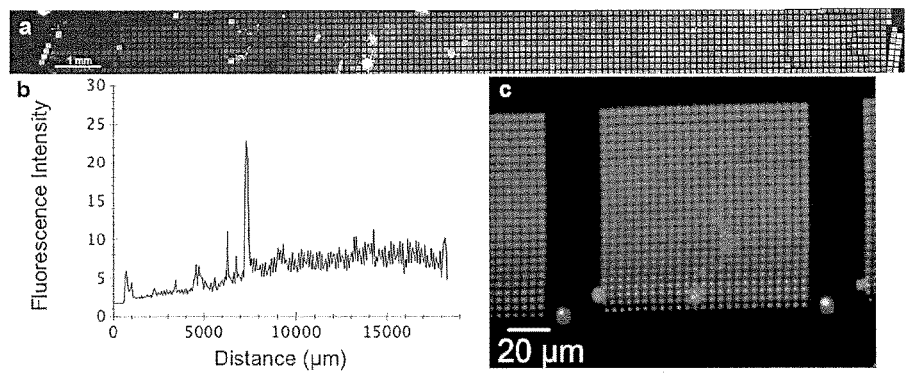
FIG. 5 shows patterned features written by a pen array inked with Rhodamine 6G with 5 mg/ml PEG sprayed on the right side and 5 mg/ml PEG sprayed on the left. (a) Fluorescent image of the patterned surface showing an increasing gradient of fluorescence intensity from left to right. (b) Profile of fluorescence intensity from (a), and (c) magnified fluorescent image of the pattern written by a single pen.

In order to quantify the ink distribution on the surface, a dual-spray coated pen array was imaged by scanning a fluorescence optical microscope across the center of the array while taking images of both fluorescence channels sequentially in each position (FIG. 4a). The counter propagating changes in fluorescence contrast indicate that the spray coating was indeed localized to either side of the array as a clear contrast change form high to background is observed starting from where each ink as sprayed and moving to the other side. Images were automatically stitched together via photomerge (Photoshop—Adobe) and converted into a 32-bit grayscale (ImageJ—Make). In order to quantify the distribution of ink, the whole image was vertically average to construct a profile plot of fluorescence intensity (FIG. 4b). The fluorescent intensity of each species is fit to a line, demonstrating the potential for dual spray coating to generate linear gradients of ink composition on polymer pen arrays.

Figure 8A:
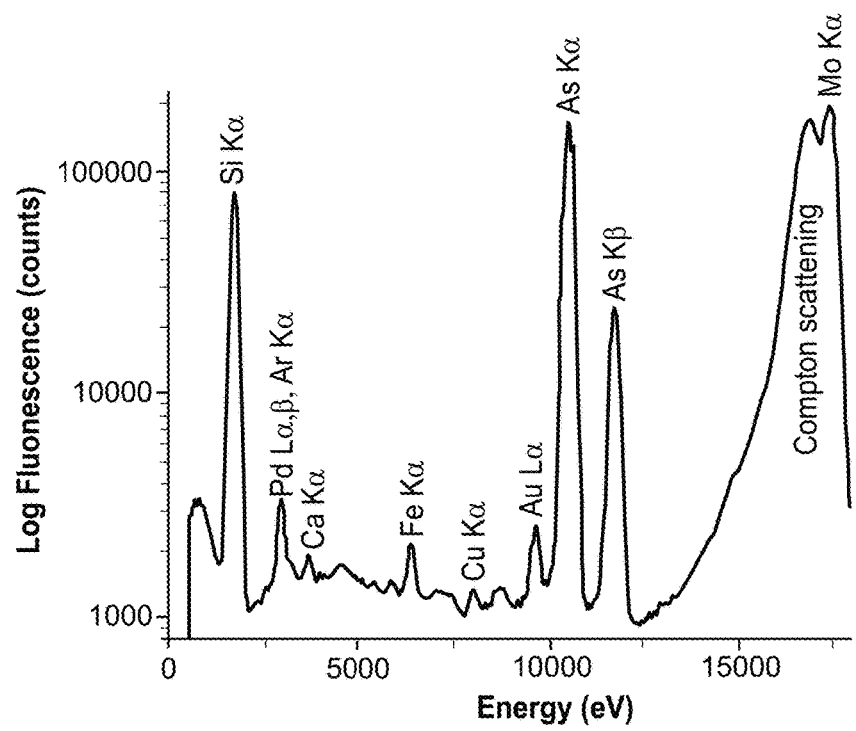
FIG. 8A shows X-ray fluorescence spectrum along with identification of relevant peaks.
Figures 8B, 9:
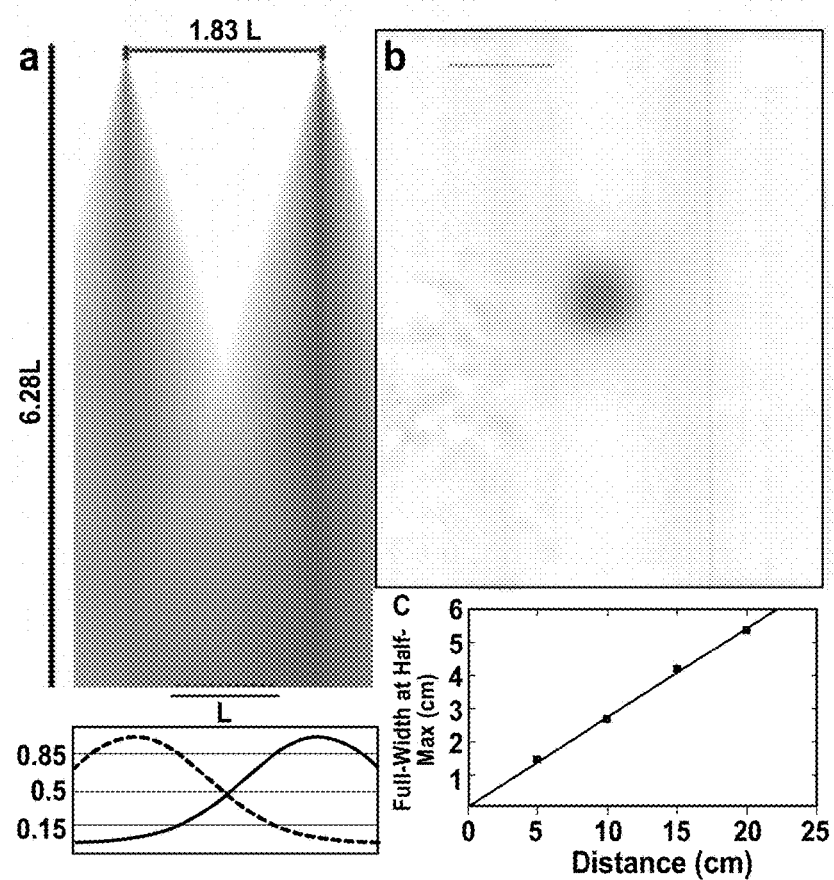
FIG. 8B shows the computed ratio of Au/Pd as a function of position along the pen array showing a gradient from 9% Au to 88% Au across the pattern array.
FIG. 9 shows (a) diagram of how to position spray guns to PPL array based on size of the array, (b) scanned spray used to quantify intensity, (c) linear full width half max slope showing a linear scaling trend for PPL arrays.

Advantageously, it was found that linear gradients deposited onto surfaces by spray-coating can be linearly scaled to provide linear gradients on any size surface. The radial distribution of ink deposition was evaluated by performing a spray-coating operation on a target substrate at multiple distances. Quantitative evaluation of this distribution was done by examining the intensity of the image in a line across the center of the image. By fitting the intensity profile to a Gaussian function, a nearly linear section from 0.15 to 0.85 normalized intensity was found (FIG. 9). Furthermore, the full width half max (FWHM) of radial spray distribution increased proportionally to the gun-sample separation distance in a manner such that the FWHN was 0.27 times the separation, which illustrates that this coating method could be readily adjusted to accommodate any array size. With this trend it is possible to tailor the airbrush spray-applicator separation between both the first and second airbrush spray-applicators and the polymer pen array based on the size of the polymer pen array. For example, when a 1.5 cm by 1.5 cm polymer pen array is used a gradient that varies from approximately 15% to 85% requires a separation of about 4 cm and 15 cm for the target, or about 5 cm and 20 cm from the target, based on the FWHM data. One of ordinary skill in the art will readily appreciate that the scaling factors will vary based on the particular spray applicator used and the spray characteristics of said spray applicator (e.g., radial spray distribution of ink). The scaling factors for a particular spray applicator can be determined according to the equations $D=a(L)$ and $d=b(L)$, wherein D is the distance between the spray applicator and the array surface, d is the distance between spray applicators, L is the length of the array, and a and b are experimental constants greater than 0 that are readily determined by evaluating the radial spray distribution at multiple distances. By mapping the radial distribution of the spray applicator as a function of distance, parameters a and b can be determined from equation fitting of the radial intensity.

In embodiments, the linear ink compositional gradient provided by at least two spray applicators to a PPL tip array having a length, L, can be scaled by positioning the at least two spray applicators at a distance of about 5.0 L to about 8.0 L, or about 5.5 L to about 7.5 L, or about 6.0 L to about 7.0 L, or about 6.0 L to about 6.75 L, or about 6.0 L to about 6.5 L, for example, about 5.0 L, about 6.0 L, about 6.25 L, about 6.5 L, about 7.0 L, or about 8.0 L, relative to the surface of the PPL tip array. In embodiments, the spray applicators are positioned at a distance of about 5.0 L to about 8.0 L relative to the surface of the PPL tip array. In embodiments, the spray applicators are positioned at a distance of about 6.2 L to about 6.3 L, relative to the surface of the PPL tip array. Further, the at least two spray applicators can be positioned at a distance of about 0.5 L to about 3.0 L, about 1.0 L to about 2.5 L, about 1.5 L to about 2.0 L, about 1.6 L to about 2.0 L, or about 1.7 L to about 1.9 L, or about 1.8 L to about 1.9 L, for example, about 0.5 L, about 1.5 L, about 1.7 L, about 1.8 L, about 1.9 L, about 2.0 L, about 2.5 L, or about 3.0 L, relative to each other (e.g., from the center of the first spray applicator to the center of the second spray applicator). In embodiments, the spray applicators are positioned at a distance of about 0.5 L to about 3.0

L, relative to each other. In embodiments, the spray applicators are positioned at a distance of about 1.8 L to about 1.9 L, relative to each other. In embodiments, the linear ink compositional gradient is about 5% to about 95%, about 10% to about 90%, or about 15% to about 85% over the length, L, of the PPL tip array.

In order to verify that spray-coated polymer pen arrays are capable of patterning surfaces with the same gradient of composition, a dual spray-coated polymer array was used to print polymer dots onto a substrate. In order to quantify the smaller quantity of material present in patterned features relative to the quantity on the pen array, fluorescence imaging was more challenging. Thus, two aqueous inks were spray-coated, both with 5 mg/ml P2VP-b-PEO and one also having 10 mg/ml rhodamine 6G to offer fluorescent contrast. Prior to patterning, the pen array and patterning instrument was held at 100% relative humidity (RH) for 30 min to ensure that the ink was hydrated. Subsequently, the array was used to print a 25×25 array of dot features on a silicon wafer that had been vapor coated with hexamethyldisilazane to render it hydrophobic (FIG. 4c). Given that this pen array contained 126×126 pens, the final pattern was composed of nearly 10 million discrete polymer features. To characterize this massive array of features, large-scale fluorescence images were reconstructed, which clearly show a macroscopic gradient in fluorescence across the patterned surface (FIG. 4a). Indeed, the average fluorescence intensity is well described by a linear gradient across the entire patterned surface (FIG. 4b).

In order to further characterize the ability of dual-spray coated pen arrays to generate compositional gradients and verify that the technique is compatible with other materials, the patterning of metal-loaded block copolymers that can be quantified using X-ray fluorescence (XRF) was explored. Specifically, it is known that the vinyl pyridine groups in P2VP-b-PEO will coordinate to metal ions and facilitate their transport to the surface; this process is the foundation of scanning probe block copolymer lithography (SPBCL) in which these patterned metals are then annealed in order to synthesize metal nanoparticles in a site specific manner. To explore the patterning of these inks, a pen array was dual spray-coated with spray guns with aqueous solutions of P2VP-b-PEO, one with 18.75 mM auric acid and the other with 18.75 mM sodium tetrachloropalladate. Subsequently, this pen array was used to pattern on a HMDS-coated silicon wafer. The resulting features were characterized using XRF, which allowed for the calculation of the local ratio of Au to Pd in sections across the array (FIG. 8b). As expected, the fraction of Au to total Au and Pd varied from 9% to 88% gold relative to palladium was obtained.

Figure 7:
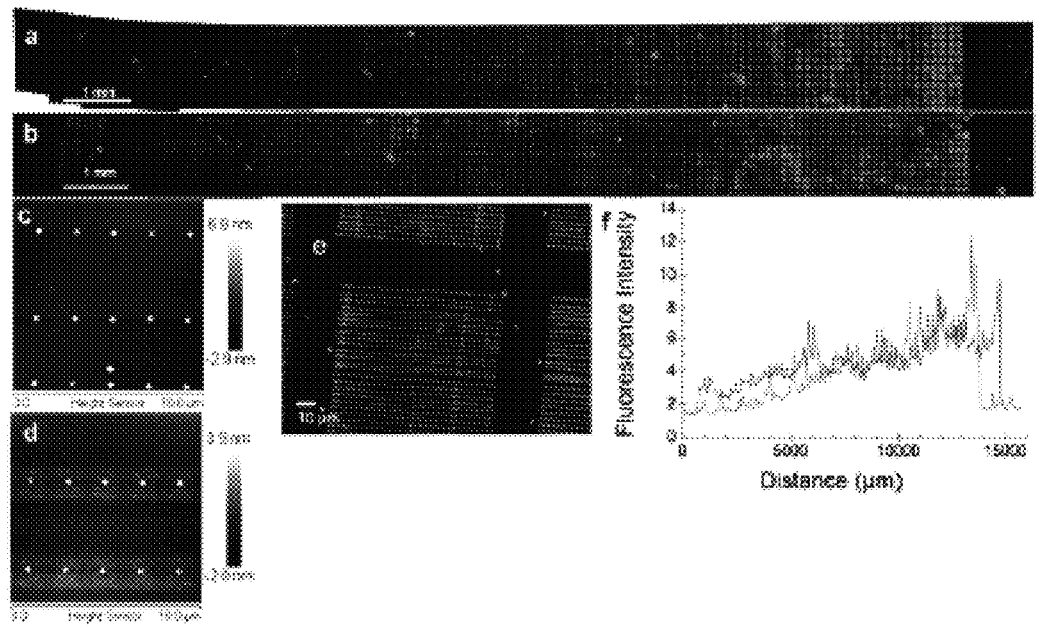
FIG. 7 shows a pattern written by a pen array inked by spray coating the bottom of the array using two spray guns to create a composition and size gradient. In particular, the left gun sprayed an aqueous solution of PEG while the right gun sprayed an aqueous solution of PEG and Rhodamine 6G. Fluorescent images showing the (a) top and (b) bottom edge of the written pattern. AFM imaging was used to measure the size of the written features on the (c) top and (d) top edge. (e) Fluorescent image of the pattern written by a single pen. (f) Vertically averaged fluorescence intensity from (a) red and (b) blue.

While the ability to generate patterns with compositional and size gradients is enabling, realizing combinatorial patterns with control over the size and composition of every feature in the pattern is the ultimate goal for high throughput science. In order to explore the ability of spray-inking to generate such combinatorial libraries, a dual-spray inking experiment was performed in which two airbrushes loaded with polymer while one was loaded with Rhodamine 6G were aimed at two adjacent corners of the pen array (FIG. 1d). Following the same patterning protocol as above, the pen array was used to write a massive scale array of dot features which were subsequently characterized with large scale fluorescence microscopy and AFM (FIG. 7).

Here, it has been shown that by spray-inking polymer pen arrays, it is possible to synthesize combinatorial libraries containing millions of sub-micron features over centimeter-scale regions. The physical processes that make this capability possible include the mixing of sprayed inks during the drying process and capillary effects that bring the majority of the applied material to the pens. These relationships suggest a subtle connection between ink viscosity, volatility, and surface tension which warrant further exploration. Importantly, the simplicity with which it is possible to define these combinatorial arrays of nanomaterials bears important consequences for many fields of study as such arrays could be useful as discovery platforms in areas as diverse as nanophotonics, heterogeneous catalysis, and cellular biology.

Polymer Pen Arrays

A defining characteristic of polymer pen lithography, in contrast with DPN and most contact printing strategies, which are typically viewed as pressure or force-independent, is that it exhibits both time- and pressure-dependent ink transport. As with DPN, features made by polymer pen lithography can exhibit a size that is linearly dependent on the square root of the tip-substrate contact time. This property of polymer pen lithography, which is a result of the diffusive characteristics of the ink and the small size of the delivery tips, allows one to pattern sub-micron features with high precision and reproducibility (variation of feature size is less than 10% under the same experimental conditions). The pressure dependence of polymer pen lithography derives from the deformable or compressible nature of the elastomer pyramid array. Indeed, the microscopic, preferably pyramidal, tips can be made to deform with successively increasing amounts of applied pressure, which can be controlled by simply extending the piezo in the vertical direction (z-piezo). Although such deformation has been regarded as a major drawback in contact printing (it can result in "roof" collapse and limit feature size resolution), with polymer pen lithography, the controlled deformation can be used as an adjustable variable, allowing one to control tip-substrate contact area and resulting feature size. Within a pressure range allowed by z-piezo extension of about 5 to about 25 μm, one can observe a near linear relationship between piezo extension and feature size at a fixed contact time. When the z-piezo extends 1 μm or more, the tips exhibit a significant and controllable deformation.

As used herein, the term "polymer pen arrays" generally refers to pen arrays for use in any polymer pen lithography method including, but not limited to, Polymer Pen Lithography, Gel Pen Lithography, and Beam Pen Lithography. Polymer pen arrays generally include elastomeric tips without cantilevers to deliver ink to a printing surface or otherwise pattern a substrate surface. The tips are preferably made of polydimethylsiloxane (PDMS) or agarose gel. For Beam Pen Lithography, the tips are formed from a material which is at least translucent to the wavelength of radiation intended for use in patterning, e.g., in a range of 300 nm to 600 nm.

A polymer pen array can include any number of tips, preferably having a pyramidal shape, which can be made by molding with a master prepared by conventional photolithography and subsequent wet chemical etching. Contemplated numbers of tips include about 1000 tips to about 15 million tips, or greater. The number of tips of the polymer pen array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips. When the sharp tips of the polymer pens are brought in contact with a substrate, ink is delivered at the points of contact.

The tips can be designed to have any shape or spacing between them, as needed. The shape of each tip can be the same or different from other tips of the array. Contemplated tip shapes include spheroid, hemispheroid, toroid, polyhedron, cone, cylinder, and pyramid (trigonal or square). The tips are sharp, so that they are suitable for forming submicron patterns, e.g., less than about 500 nm. For example, the tip ends can have a diameter in a range of about 50 nm to about 1 µm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. For example, the maximum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The sharpness of the tip is measured by its radius of curvature, and the radius of curvature of the tips disclosed herein is below 1 µm, and can be less than about 0.9 µm, less than about 0.8 µm, less than about 0.7 µm, less than about 0.6 µm, less than about 0.5 µm, less than about 0.4 µm, less than about 0.3 µm, less than about 0.2 µm, less than about 0.1 µm, less than about 90 nm, less than about 80 nm, less than about 70 nm, less than about 60 nm, or less than about 50 nm.

The tips of the pen array can be designed to have any desired thickness, for example, the thickness of the tip array is about 50 nm to about 50 µm, about 10 µm to about 50 µm, about 50 nm to about 1 µm, about 50 nm to about 500 nm, about 50 nm to about 400 nm, about 50 nm to about 300 nm, about 50 nm to about 200 nm, or about 50 nm to about 100 nm. For example, the minimum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. For example, the maximum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. The thickness of the pen array can be decreased as the rigidity of the polymer used to form the tip substrate layer increases. For example, for a gel polymer (e.g., agarose), the tip array can have a thickness in a range of about 10 µm to about 50 µm. For other polymers (e.g., PDMS), for example, the tip array can have a thickness of about 50 nm to about 1 µm. As used herein, the thickness of the tip array refers to the distance from the tip end to the base end of a tip. The tips can be arranged randomly or in any pattern, including a regular periodic pattern (e.g., in columns and rows, in a circular or radial pattern, or the like). The tips have a base portion fixed to the tip substrate layer. The base portion preferably is larger than the tip end portion. The base portion can have an edge length in a range of about 1 µm to about 50 µm, or about 5 µm to about 50 µm. For example, the minimum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 µm. For example, the maximum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 µm. The tip array is preferably formed such that the tip ends lie in a single plane, although alternative arrangements are also contemplated.

The polymers suitable for use in the pen array can be any polymer having a compressibility and/or deformability compatible with the lithographic methods. In one embodiment, the polymer is deformable; in another embodiment the polymer is compressible. Polymeric materials suitable for use in the pen array can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. No. 5,776,748; U.S. Pat. No. 6,596,346; and U.S. Pat. No. 6,500,549, each of which is hereby incorporated by reference in its entirety. Other suitable polymers include those disclosed by He et al., *Langmuir* 2003, 19, 6982-6986; Donzel et al., *Adv. Mater.* 2001, 13, 1164-1167; and Martin et al., *Langmuir*, 1998, 14-15, 3791-3795. Hydrophobic polymers such as polydimethylsiloxane can be modified either chemically or physically by, for example, exposure to a solution of a strong oxidizer or to an oxygen plasma.

Alternatively, the polymer of the tip array can be a polymer gel. The polymer gel can comprise any suitable gel, including hydrogels and organogels. For example, the polymer gel can be a silicone hydrogel, a branched polysaccharide gel, an unbranched polysaccharide gel, a polyacrylamide gel, a polyethylene oxide gel, a cross-linked polyethylene oxide gel, a poly(2-acrylamido-2-methyl-1-propanesulfonic acid) (polyAMPS) gel, a polyvinylpyrrolidone gel, a cross-linked polyvinylpyrrolidone gel, a methylcellulose gel, a hyaluronan gel, and combinations thereof. For example, the polymer gel can be an agarose gel. By weight, gels are mostly liquid, for example, gels can be greater than 95% liquid, yet behave like solids due to the presence of a cross-linked network within the liquid. The gel polymer can be, for example, hydrophilic and/or porous, allowing for absorption of a pattern composition.

The polymer of the pen array has a suitable compression modulus and surface hardness to prevent collapse of the polymer during inking and printing, but too high a modulus and too great a surface hardness can lead to a brittle material that cannot adapt and conform to a substrate surface during printing. As disclosed in Schmid, et al., *Macromolecules*, 33:3042 (2000), vinyl and hydrosilane prepolymers can be tailored to provide polymers of different modulus and surface hardness. Thus, in some cases, the polymer is a mixture of vinyl and hydrosilane prepolymers, where the weight ratio of vinyl prepolymer to hydrosilane crosslinker is about 5:1 to about 20:1, about 7:1 to about 15:1, or about 8:1 to about 12:1.

The polymers of the pen array preferably will have a surface hardness of about 0.2% to about 3.5% of glass, as measured by resistance of a surface to penetration by a hard sphere with a diameter of 1 mm, compared to the resistance of a glass surface (as described in Schmid, et al., *Macromolecules*, 33:3042 (2000) at p 3044). The surface hardness can be about 0.3% to about 3.3%, about 0.4% to about 3.2%, about 0.5% to about 3.0%, or about 0.7% to about 2.7%. The polymers of the tip array can have a compression modulus of about 10 MPa to about 300 MPa. The pen array preferably comprises a compressible polymer or a deformable polymer which is Hookean under pressures of about 10 MPa to about 300 MPa. The linear relationship between pressure exerted on the pen array and the feature size allows for control of the indicia printed using the disclosed methods and pen arrays.

The pen array can comprise a polymer that has adsorption and/or absorption properties for the patterning composition, such that the tip array acts as its own patterning composition reservoir. For example, PDMS is known to adsorb patterning inks, see, e.g., U.S. Patent Publication No. 2004/228962, Zhang, et al., *Nano Lett.* 4, 1649 (2004), and Wang et al., *Langmuir* 19, 8951 (2003).

The tips of the pen array can be fixed to a common substrate. For polymer pen arrays for use with Beam Pen Lithography, the common substrate can be formed of a transparent polymer. The tips can be arranged randomly or in any pattern, including a regular periodic pattern (e.g., in columns and rows, in a circular pattern, or the like). The common substrate can comprise, for example, an elastomeric layer, which can comprise the same polymer that forms the tips of the tip array, or can comprise an elastomeric polymer that is different from that of the tip array. For example, the common substrate can be a gel backing layer. Suitable gels include those described herein in connection with polymer gels for use as tip materials. The elastomeric layer can have a thickness of about 50 µm to about 100 µm. The common substrate layer can have any suitable thickness, for example, in a range of about 50 µm to about 5 mm, about 50 µm to about 100 µm, or about 1 mm to about 5 mm. For example, the common substrate layer can have a minimum thickness of about 50, 100, 200, 300, 400, 500, 600, 700, 800, 900, 1000, 2000, 3000, 4000, or 5000 µm. For example, the common substrate layer can have a maximum thickness of about 50, 100, 200, 300, 400, 500, 600, 700, 800, 900, 1000, 2000, 3000, 4000, or 5000 µm. The thickness of the common substrate layer can be decreased as the rigidity of the polymer used to form the common substrate layer increases. For example, for a gel polymer (e.g., agarose), the common substrate layer can have a thickness in a range of about 1 mm to about 5 mm. For other, more rigid, polymers (e.g., PDMS) the common substrate layer can have a thickness in a range of about 50 µm to about 100 µm, for example. The tip array can be affixed or adhered to a rigid support (e.g., glass, such as a glass slide). In various cases, the common substrate, the tip array, and/or the rigid support, if present, is translucent or transparent. In a specific case, each is translucent or transparent. The combined thickness of the tip substrate layer and the tips can be in range of about 50 µm to about 5 mm. The thickness of combination of the tip array and common substrate can be less than about 200 µm, preferably less than about 150 µm, or more preferably about 100 µm.

The polymer backing layer is preferably adhered to a rigid support (e.g., a glass, silicon, quartz, ceramic, polymer, or any combination thereof), e.g., prior to or via curing of the polymer. The rigid support is preferably highly rigid and has a highly planar surface upon which to mount the array (e.g., silica glass, quartz, and the like). The rigid support and thin backing layer significantly improve the uniformity of the polymer pen array over large areas, such as a three inch wafer surface, and make possible the leveling and uniform, controlled use of the array.

The tip-to-tip spacing between adjacent tips (tip pitch) can be in any desired range, including a range of about 1 µm to about over 10 mm, or about 20 µm to about 1 mm. For example, the minimum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm. For example, the maximum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm.

Polymer pen arrays for use in Beam Pen Lithography generally include a pen array with each tip having a blocking layer disposed thereon, and with an aperture defined in the blocking layer, exposing the transparent tip end (e.g., the photosensitive layer-contacting end of each of the tips). The blocking layer can be coated on the sidewalls of the tips and on portions of the common substrate layer between the tips. The blocking layer serves as a radiation blocking layer, channeling the radiation through the material of the tip and out the exposed tip end. The tips can be used to both channel the radiation to a surface in a massively parallel scanning probe lithographic process and to control one or more parameters such as the distance between the tip and the substrate, and the degree of tip deformation. Control of such parameters can allow one to take advantage of near-field effects. In one embodiment, the tips are elastomeric and reversibly deformable, which can allow the tip array to be brought in contact with the substrate without damage to the substrate or the tip array. This contact can ensure the generation of near-field effects.

The blocking layer on the polymer tip sidewalls serves as a radiation blocking layer, allowing the radiation illuminated on a surface of the substrate layer opposite the surface to which the tips are fixed to be emitted only through the tip end exposed by the aperture defined in the blocking layer. The exposure of a substrate pre-coated with a resist layer with the radiation channeled through the tip ends of the tip array can allow for the formation of a single dot per tip for each exposure. The blocking layer can be formed of any material suitable for blocking (e.g., reflecting) a type of radiation used in the lithography process. For example, the blocking layer can be a metal, such as gold, when used with UV light. Other suitable blocking layers include, but are not limited to, gold, chromium, titanium, silver, copper, nickel, silicon, aluminum, opaque organic molecules and polymers, and combinations thereof. The blocking layer can have any suitable thickness, for example, in a range of about 40 nm to about 500 nm. For example, the minimum thickness can be about 40, 45, 50, 55, 60, 65, 70, 75, 80, 85, 90, 95, 100, 150, 200, 250, 300, 350, 400, 450, or 500 nm. For example, the maximum thickness can be about 40, 45, 50, 55, 60, 65, 70, 75, 80, 85, 90, 95, 100, 150, 200, 250, 300, 350, 400, 450, or 500 nm.

As with polymer pen arrays for Polymer Pen Lithography and Gel Pen Lithography, the tips of the pen array for use with BPL can be made by molding with a master prepared by conventional photolithography and subsequent wet chemical etching. Optionally, the tips can be cleaned, for example, using oxygen plasma, prior to coating with the blocking layer. The blocking layer can be disposed on the tips by any suitable process, including coating, for example, spin-coating, the tips with the blocking layer.

An aperture in the blocking layer can be formed by any suitable method, including, for example, focused ion beam (FIB) methods or using a lift-off method. The lift-off method can be a dry lift off method. One suitable approach includes applying an adhesive, such as poly(methyl methacrylate) (PMMA) on top of the blocking layer of the tip array, and removing a portion of the adhesive material disposed at the substrate contacting end of the tips by contacting the pen array to a clean and flat surface, for example, a glass surface. The tips can then be immersed in an etching solution to remove the exposed portion of the blocking layer to form the aperture and expose the material of the tip, e.g. the transparent polymer. The remaining adhesive material protects the covered surfaces of the blocking layer from being etched during the etching step. The adhesive can be, for example, PMMA, poly(ethylene glycol) (PEG), polyacrylonitrile, and combinations thereof.

Alternatively, a simple contact approach can be used in which a pen array having the blocking layer is brought in contact with a glass slide or other surface coated with an adhesive material, such as PMMA. Other suitable adhesive materials include, for example, PMMA, PEG, polyacrylonitrile, and combinations thereof. Upon removal of the pen tip from surface coated with the adhesive material, the adhesive material removes the contacted portion of the blocking layer, thereby defining an aperture and exposing the tip material, e.g. the transparent polymer.

In either of the above described aperture forming methods, the size of the aperture formed can be controlled by applying different external forces on the backside of the BPL pen array. As a result of the flexibility of elastomeric tips, the application of force on the backside of the BPL tip array can be used to control the contact area between the tips and adhesive material surface. For example, the BPL pen array can include pyramidal tips, with each pyramid-shaped tip being covered by a gold blocking layer having a small aperture defined in the blocking layer at the very end of the tip. The size of the aperture does not significantly change from tip to tip. For example, the size of the aperture can vary less than about 10% from tip to tip. The size of the aperture can be tailored over the 200 nm to 1 to 10 μm ranges, for example, by controlling contact force. For example, the aperture can have a diameter in a range of about 5 nm to about 5 μm, about 30 nm to about 500 nm, or about 200 nm to about 5 μm. For example, the minimum aperture diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. For example, the maximum aperture diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. The contact force optionally can be in a range of about 0.002 N to about 0.2 N for a 1 $cm^2$ pen array.

Patterning Compositions

Two or more patterning compositions, alternatively called "ink compositions" herein, are coated onto the tip array disclosed herein for the disclosed lithography methods. One patterning composition is coated, e.g., using a spray dry technique, at one side of the tip array, and a second patterning composition is coated, e.g., using a spray dry technique, at the other side of the tip array. The result will be a gradient of the two patterning compositions along the tip array, with the first patterning composition being in higher concentration at the side of the tip array it was sprayed, and decreasing in concentration as one moves along the x-axis of the tip array to the other side. Similarly, the second patterning composition increases in concentration when moving from the side of the tip array that was sprayed with the first patterning composition to the side of the tip array that was sprayed with the second patterning composition. Additional patterning compositions can be coated on the tip array, to arrive at gradient patterning compositions of three, four, five, or six different compositions, for example.

Patterning compositions suitable for use in the disclosed methods include both homogeneous and heterogeneous compositions, the latter referring to a composition having more than one component. The patterning composition is coated on the tip array. The term "coating," as used herein, refers both to coating of the tip array as well adsorption and absorption by the tip array of the patterning composition. Upon coating of the tip array with the patterning composition, the patterning composition can be patterned on a substrate surface using the tip array.

Patterning compositions can be liquids, solids, semi-solids, and the like. Patterning compositions suitable for use include, but are not limited to, molecular solutions, polymer solutions, pastes, gels, creams, glues, resins, epoxies, adhesives, metal films, particulates, solders, etchants, and combinations thereof.

Patterning compositions can include materials such as, but not limited to, monolayer-forming species, thin film-forming species, oils, colloids, metals, metal complexes, metal oxides, ceramics, organic species (e.g., moieties comprising a carbon-carbon bond, such as small molecules, polymers, polymer precursors, proteins, antibodies, and the like), polymers (e.g., both non-biological polymers and biological polymers such as single and double stranded DNA, RNA, and the like), polymer precursors, dendrimers, nanoparticles, and combinations thereof. In some embodiments, one or more components of a patterning composition includes a functional group suitable for associating with a substrate, for example, by forming a chemical bond, by an ionic interaction, by a Van der Waals interaction, by an electrostatic interaction, by magnetism, by adhesion, and combinations thereof.

In some embodiments, the composition can be formulated to control its viscosity. Parameters that can control ink viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between ink components (e.g., solvent-thickener interactions), and combinations thereof.

In some embodiments, the patterning composition comprises an additive, such as a solvent, a thickening agent, an ionic species (e.g., a cation, an anion, a zwitterion, etc.) the concentration of which can be selected to adjust one or more of the viscosity, the dielectric constant, the conductivity, the tonicity, the density, and the like.

Suitable thickening agents include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide, polyethylene glycol, and polypropylene oxide), agar, agarose, xanthan gums, gelatin, dendrimers, colloidal silicon dioxide, lipids (e.g., fats, oils, steroids, waxes, glycerides of fatty acids, such as oleic, linoleic, linolenic, and arachidonic acid, and lipid bilayers such as from phosphocholine) and combinations thereof. In some embodiments, a thickener is present in a concentration of about 0.5% to about 25%, about 1% to about 20%, or about 5% to about 15% by weight of a patterning composition.

Suitable solvents for a patterning composition include, but are not limited to, water, C1-C8 alcohols (e.g., methanol, ethanol, propanol and butanol), C6-C12 straight chain, branched and cyclic hydrocarbons (e.g., hexane and cyclohexane), C6-C14 aryl and aralkyl hydrocarbons (e.g., benzene and toluene), C3-C10 alkyl ketones (e.g., acetone), C3-C10 esters (e.g., ethyl acetate), C4-C10 alkyl ethers, and combinations thereof. In some embodiments, a solvent is present in a concentration of about 1% to about 99%, about 5% to about 95%, about 10% to about 90%, about 15% to about 95%, about 25% to about 95%, about 50% to about 95%, or about 75% to about 95% by weight of a patterning composition.

Patterning compositions can comprise an etchant. As used herein, an "etchant" refers to a component that can react with a surface to remove a portion of the surface. Thus, an etchant is used to form a subtractive feature by reacting with a surface and forming at least one of a volatile and/or soluble material that can be removed from the substrate, or a residue, particulate, or fragment that can be removed from the substrate by, for example, a rinsing or cleaning method. In some embodiments, an etchant is present in a concentration of about 0.5% to about 95%, about 1% to about 90%, about 2% to about 85%, about 0.5% to about 10%, or about 1% to about 10% by weight of the patterning composition.

Etchants suitable for use in the methods disclosed herein include, but are not limited to, an acidic etchant, a basic etchant, a fluoride-based etchant, and combinations thereof. Acidic etchants suitable for use with the present invention include, but are not limited to, sulfuric acid, trifluoromethanesulfonic acid, fluorosulfonic acid, trifluoroacetic acid, hydrofluoric acid, hydrochloric acid, carborane acid, and combinations thereof. Basic etchants suitable for use with the present invention include, but are not limited to, sodium hydroxide, potassium hydroxide, ammonium hydroxide, tetraalkylammonium hydroxide ammonia, ethanolamine, ethylenediamine, and combinations thereof. Fluoride-based etchants suitable for use with the present invention include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof.

In some embodiments, the patterning composition includes a reactive component. As used herein, a "reactive component" refers to a compound or species that has a chemical interaction with a substrate. In some embodiments, a reactive component in the ink penetrates or diffuses into the substrate. In some embodiments, a reactive component transforms, binds, or promotes binding to exposed functional groups on the surface of the substrate. Reactive components can include, but are not limited to, ions, free radicals, metals, acids, bases, metal salts, organic reagents, and combinations thereof. Reactive components further include, without limitation, monolayer-forming species such as thiols, hydroxides, amines, silanols, siloxanes, and the like, and other monolayer-forming species known to a person or ordinary skill in the art. The reactive component can be present in a concentration of about 0.001% to about 100%, about 0.001% to about 50%, about 0.001% to about 25%, about 0.001% to about 10%, about 0.001% to about 5%, about 0.001% to about 2%, about 0.001% to about 1%, about 0.001% to about 0.5%, about 0.001% to about 0.05%, about 0.01% to about 10%, about 0.01% to about 5%, about 0.01% to about 2%, about 0.01% to about 1%, about 10% to about 100%, about 50% to about 99%, about 70% to about 95%, about 80% to about 99%, about 0.001%, about 0.005%, about 0.01%, about 0.1%, about 0.5%, about 1%, about 2%, or about 5% weight of the patterning composition.

The patterning composition can further comprise a conductive and/or semi-conductive component. As used herein, a "conductive component" refers to a compound or species that can transfer or move electrical charge. Conductive and semi-conductive components include, but are not limited to, a metal, a nanoparticle, a polymer, a cream solder, a resin, and combinations thereof. In some embodiments, a conductive component is present in a concentration of about 1% to about 100%, about 1% to about 10%, about 5% to about 100%, about 25% to about 100%, about 50% to about 100%, about 75% to about 99%, about 2%, about 5%, about 90%, about 95% by weight of the patterning composition.

Metals suitable for use in a patterning composition include, but are not limited to, a transition metal, aluminum, silicon, phosphorous, gallium, germanium, indium, tin, antimony, lead, bismuth, alloys thereof, and combinations thereof.

In some embodiments, the patterning composition comprises a semi-conductive polymer. Semi-conductive polymers suitable for use with the present invention include, but are not limited to, a polyaniline, a poly(3,4-ethylenedioxythiophene)-poly(styrenesulfonate), a polypyrrole, an arylene vinylene polymer, a polyphenylenevinylene, a polyacetylene, a polythiophene, a polyimidazole, and combinations thereof.

The patterning composition can include an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use in the methods disclosed herein include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, a polyimide, and combinations thereof. In some embodiments, for example, an insulating component is present in a concentration of about 1% to about 95%, about 1% to about 80%, about 1% to about 50%, about 1% to about 20%, about 1% to about 10%, about 20% to about 95%, about 20% to about 90%, about 40% to about 80%, about 1%, about 5%, about 10%, about 90%, or about 95% by weight of the patterning composition.

The patterning composition can include a masking component. As used herein, a "masking component" refers to a compound or species that upon reacting forms a surface feature resistant to a species capable of reacting with the surrounding surface. Masking components suitable for use with the present invention include materials commonly employed in traditional photolithography methods as "resists" (e.g., photoresists, chemical resists, self-assembled monolayers, etc.). Masking components suitable for use in the disclosed methods include, but are not limited to, a polymer such as a polyvinylpyrollidone, poly(epichlorohydrin-co-ethyleneoxide), a polystyrene, a poly(styrene-co-butadiene), a poly(4-vinylpyridine-co-styrene), an amine terminated poly(styrene-co-butadiene), a poly(acrylonitrile-co-butadiene), a styrene-butadiene-styrene block copolymer, a styrene-ethylene-butylene block linear copolymer, a polystyrene-block-poly(ethylene-ran-butylene)-block-polystyrene, a poly(styrene-co-maleic anhydride), a polystyrene-block-poly(ethylene-ran-butylene)-block-polystyrene-graft-mal-eic anhydride, a polystyrene-block-polyisoprene-block-polystyrene, a polystyrene-block-poly(ethylene-ran-butylene)-block-polystyrene, a polynorbornene, a dicarboxy terminated poly(acrylonitrile-co-butadiene-co-acrylic acid), a dicarboxy terminated poly(acrylonitrile-co-butadiene), a polyethyleneimine, a poly(carbonate urethane), a poly(acrylonitrile-co-butadiene-co-styrene), a poly(vinylchloride), a poly(acrylic acid), a poly(methylmethacrylate), a poly(methyl methacrylate-co-methacrylic acid), a polyisoprene, a poly(1,4-butylene terephthalate), a polypropylene, a poly(vinyl alcohol), a poly(1,4-phenylene sulfide), a polylimonene, a poly(vinylalcohol-co-ethylene), a poly[N,N'-(1,3-phenylene)isophthalamide], a poly(1,4-phenylene ether-ether-sulfone), a poly(ethyleneoxide), a poly[butylene terephthalate-co-poly(alkylene glycol) terephthalate], a poly(ethylene glycol) diacrylate, a poly(4-vinylpyridine), a poly(DL-lactide), a poly(3,3',4,4'-benzophenonetetracarboxylic dianhydride-co-4,4'-oxydianiline/1,3-phenylenediamine), an agarose, a polyvinylidene fluoride homopolymer, a styrene butadiene copolymer, a phenolic resin, a ketone resin, a 4,5-difluoro-2,2-bis(trifluoromethyl)-1,3-dioxane, a salt thereof, and combinations thereof. In some embodiments, a masking component is present in a concentration of about 1% to about 10%, about 1% to about 5%, or about 2% by weight of the patterning composition.

The patterning composition can include a conductive component and a reactive component. For example, a reactive component can promote at least one of: penetration of a conductive component into a surface, reaction between the conductive component and a surface, adhesion between a conductive feature and a surface, promoting electrical contact between a conductive feature and a surface, and combinations thereof. Surface features formed by reacting this patterning composition include conductive features selected from the group consisting of: additive non-penetrating, additive penetrating, subtractive penetrating, and conformal penetrating surface features.

The patterning composition can comprise an etchant and a conductive component, for example, suitable for producing a subtractive surface feature having a conductive feature inset therein.

The patterning composition can comprise an insulating component and a reactive component. For example, a reactive component can promote at least one of: penetration of an insulating component into a surface, reaction between the insulating component and a surface, adhesion between an insulating feature and a surface, promoting electrical contact between an insulating feature and a surface, and combinations thereof. Surface features formed by reacting this patterning composition include insulating features selected from the group consisting of: additive non-penetrating, additive penetrating, subtractive penetrating, and conformal penetrating surface features.

The patterning composition can comprise an etchant and an insulating component, for example, suitable for producing a subtractive surface feature having an insulating feature inset therein.

The patterning composition can comprise a conductive component and a masking component, for example, suitable for producing electrically conductive masking features on a surface.

Other contemplated components of a patterning composition suitable for use with the disclosed methods include thiols, 1,9-Nonanedithiol solution, silane, silazanes, alkynes cystamine, N-Fmoc protected amino thiols, biomolecules, DNA, proteins, antibodies, collagen, peptides, biotin, and carbon nanotubes.

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkyl-siloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interfate Sci., 49, 410-421 (1974) (carboxylic acids on copper); Iler, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492 (1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment of thiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver); Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-805 (1994) (attachment of thiols to silver); Li et al., J. Phys. Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B, 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to $SiO_2$); Pereira et al., J. Mater. Chem., 10, 259 (2000) (attachment of silazanes to $SiO_2$); Dammel, Diazonaphthoquinone Based Resists (1st ed., SPIE Optical Engineering Press, Bellingham, Wash., 1993) (attachment of silazanes to $SiO_2$); Anwander et al., J. Phys. Chem. B, 104, 3532 (2000) (attachment of silazanes to $SiO_2$); Slavov et al., J. Phys. Chem., 104, 983 (2000) (attachment of silazanes to $SiO_2$).

Substrates to be Patterned

Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, films thereof, thin films thereof, laminates thereof, foils thereof, composites thereof, and combinations thereof. A substrate can comprise a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof. A substrate can comprise a glass such as, but not limited to, undoped silica glass ($SiO_2$), fluorinated silica glass, borosilicate glass, borophosphorosilicate glass, organosilicate glass, porous organosilicate glass, and combinations thereof. The substrate can be a non-planar substrate, such as pyrolytic carbon, reinforced carbon-carbon composite, a carbon phenolic resin, and the like, and combinations thereof. A substrate can comprise a ceramic such as, but not limited to, silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, such as, but not limited to: a plastic, a metal, a composite thereof, a laminate thereof, a thin film thereof, a foil thereof, and combinations thereof.

The surfaces to pattern by BPL can include any suitable substrate, and preferably one which can be advantageously affected by exposure to radiation. See International Patent Application No. PCT/US2010/024633, the entire disclosure of which is incorporated herein by reference. For example, the substrate can be photosensitive or can include a photosensitive layer. For example, the photosensitive substrate or photosensitive layer can be a resist layer. The resist layer can be any known resist material, for example SHIPLEY1805 (MicroChem Inc.). Other suitable resist materials include, but are not limited to, Shipley1813 (MicroChem Inc.), Shipley1830 (MicroChem Inc.), PHOTORESIST AZ1518 (MicroChemicals, Germany), PHOTORESIST AZ5214 (MicroChemicals, Germany), SU-8, and combinations thereof. Other examples of photosensitive materials include, but are not limited to, liquid crystals and metals. For examples, the substrate can include metal salts that can be reduced when exposed to the radiation. Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, and laminates and combinations thereof. The substrate can be in the form of films, thin films, foils, and combinations thereof. A substrate can comprise a semiconductor including, but not limited to one or more of: crystalline silicon, polycrystalline silicon, amorphous silicon, p-doped silicon, n-doped silicon, silicon oxide, silicon germanium, germanium, gallium arsenide, gallium arsenide phosphide, indium tin oxide, graphene, and combinations thereof. A substrate can comprise a glass including, but not limited to, one or more of undoped silica glass ($SiO_2$), fluorinated silica glass, borosilicate glass, borophosphorosilicate glass, organosilicate glass, porous organosilicate glass, and combinations thereof. The substrate can be a non-planar substrate, including, but not limited to, one or more of pyrolytic carbon, reinforced carbon-carbon composite, a carbon phenolic resin, and combinations thereof. A substrate can comprise a ceramic including, but not limited to, one or more of silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, including, but not limited to one or more of: a plastic, a metal, a composite thereof, a laminate thereof, a thin film thereof, a foil thereof, and combinations thereof.

The photosensitive substrate or the photosensitive layer can have any suitable thickness, for example in a range of about 100 nm to about 5000 nm. For example, the minimum photosensitive substrate or photosensitive layer thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. For example, the maximum photosensitive substrate or photosensitive layer thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. The diameter of the indicia formed by the pen array can be modulated by modifying the resist material used and/or the thickness of the photosensitive substrate or photosensitive layer. For example, under the same radiation conditions, a thicker photosensitive layer can result in indicia having larger diameters. At constant photosensitive layer thickness, an increase in radiation intensity can results in indicia having larger diameters.

Leveling of the Tip Array and Deposition of Patterning Composition onto Substrate Surface The disclosed methods provide the ability for in situ imaging capabilities, similar to scanning probe microscope-based lithography methods (e.g., dip pen lithography) as well as the ability to pattern a feature in a fast fashion, similar to micro-contact printing. The features that can be patterned range from sub-100 nm to 1 mm in size or greater, and can be controlled by altering the contacting time and/or the contacting pressure of the tip array. Similar to DPN, the amount of patterning composition (as measured by feature size) deposited onto a substrate surface is proportional to the contacting time, specifically a square root correlation with contacting time. Unlike DPN, the contacting pressure of the tip array can be used to modify the amount of patterning composition that can be deposited onto the substrate surface. The pressure of the contact can be controlled by the z-piezo of a piezo scanner. The more pressure (or force) exerted on the tip array, the larger the feature size. Thus, any combination of contacting time and contacting force/pressure can provide a means for the formation of a feature size from about 30 nm to about 1 mm or greater. The ability to prepare features of such a wide range of sizes and in a "direct writing" or in situ manner in milliseconds makes the disclosed lithography method adaptable to a host of lithography applications, including electronics (e.g., patterning circuits) and biotechnology (e.g., arraying targets for biological assays). The contacting pressure of the tip array can be about 10 MPa to about 300 MPa.

At very low contact pressures, such as pressures of about 0.01 to about 0.1 $g/cm^2$ for the preferred materials described herein, the feature size of the resulting indicia is independent of the contacting pressure, which allows for one to level the tip array on the substrate surface without changing the feature size of the indicia. Such low pressures are achievable by 0.5 μm or less extensions of the z-piezo of a piezo scanner to which a tip array is mounted, and pressures of about 0.01 $g/cm^2$ to about 0.1 $g/cm^2$ can be applied by z-piezo extensions of less than 0.5 μm. This "buffering" pressure range allows one to manipulate the tip array, substrate, or both to make initial contact between tips and substrate surface without compressing the tips, and then using the degree of compression of tips (observed by changes in reflection of light off the inside surfaces of the tips) to achieve a uniform degree of contact between tips and substrate surface. This leveling ability is important, as non-uniform contact of the tips of the tip array can lead to non-uniform indicia. Given the large number of tips of the tip array (e.g., 11 million in an example provided herein) and their small size, as a practical matter it may be difficult or impossible to know definitively if all of the tips are in contact with the surface. For example, a defect in a tip or the substrate surface, or an irregularity in a substrate surface, may result in a single tip not making contact while all other tips are in uniform contact. Thus, the disclosed methods provide for at least substantially all of the tips to be in contact with the substrate surface (e.g., to the extent detectable). For example, at least 90%, at least 95%, at least 96%, at least 97%, at least 98%, or at least 99% of the tips will be in contact with the substrate surface.

The leveling of the tip array and substrate surface with respect to one another can be assisted by the fact that with a transparent, or at least translucent, tip array and common substrate arrangement, one can observe the change in reflection of light that is directed from the top of the tip array (i.e., behind the base of the tips and common substrate) through to the substrate surface. The intensity of light reflected from the tips of the tip array gets greater upon contact with the substrate surface (e.g., the internal surfaces of the tip array reflect light differently upon contact). By observing the change in reflection of light at each tip, one can adjust the tip array and/or the substrate surface to effect contact of substantially all or all of the tips of the tip array to the substrate surface. Thus, the tip array and common substrate preferably are translucent or transparent to allow for observing the change in light reflection of the tips upon contact with the substrate surface. Likewise, any rigid backing material to which the tip array is mounted is also preferably at least transparent or translucent.

The contacting time for the tips can be from about 0.001 s to about 60 s, depending upon the amount of patterning composition desired in any specific point on a substrate surface. The contacting force can be controlled by altering the z-piezo of the piezo scanner or by other means that allow for controlled application of force across the tip array.

The substrate surface can be contacted with a tip array a plurality of times, wherein the tip array, the substrate surface or both move to allow for different portions of the substrate surface to be contacted. The time and pressure of each contacting step can be the same or different, depending upon the desired pattern. The shape of the indicia or patterns has no practical limitation, and can include dots, lines (e.g., straight or curved, formed from individual dots or continuously), a preselected pattern, or any combination thereof.

In some cases, the indicia resulting from the disclosed methods can have a high degree of sameness, and thus are uniform or substantially uniform in size, and preferably also in shape. The individual indicia feature size (e.g., a dot or line width) is highly uniform, for example within a tolerance of about 5%, or about 1%, or about 0.5%. The tolerance can be about 0.9%, about 0.8%, about 0.7%, about 0.6%, about 0.4%, about 0.3%, about 0.2%, or about 0.1%. Non-uniformity of feature size and/or shape can lead to roughness of indicia that can be undesirable for sub-micron type patterning.

The feature size can be about 10 nm to about 1 mm, about 10 nm to about 500 µm, about 10 nm to about 100 µm, about 50 nm to about 100 µm, about 50 nm to about 50 µm, about 50 nm to about 10 µm, about 50 nm to about 5 µm, or about 50 nm to about 1 µm. Features sizes can be less than 1 µm, less than about 900 nm, less than about 800 nm, less than about 700 nm, less than about 600 nm, less than about 500 nm, less than about 400 nm, less than about 300 nm, less than about 200 nm, less than about 100 nm, or less than about 90 nm.

The methods in accordance with the disclosure can be better understood in light of the following examples.

EXAMPLES

All pen arrays were plasma cleaned for 2 min under oxygen at 60 W prior to spray inking. The ink solutions (150 µL per gun) were spray-coated onto the array using Harder Steenbeck Infinity CR plus airbrushes with 0.15 mm needles and an Iwata Power Jet Pro IS-975 dual piston compressor at 20 PSI airflow (or equivalent). When two or more airbrushes were used, the airbrushes were sprayed in unison. After spraying, the arrays were placed on their side with the tips facing up and covered for 15 minutes while the solution dried. The arrays were sprayed and dried a total of three times. Custom airbrush holders were designed on TinkerCad, rendered in Slic3r, and 3D printed out of polylactic acid using a SeeMeCNC Orion Delta 3D printer.

To prepare the substrates, silicon wafers were vapor coated in a desiccator for 24 hr with hexamethyldisilazane in hexane to render it hydrophobic. Patterning was performed with a Park XE-150 (or equivalent) in a humidity control chamber at a relative humidity between 70-95% and at room temperature with a 30 min incubation period prior to patterning.

In order to convert polymer features into nanoparticles, the substrate was put into a tube furnace and thermally annealed. The heating conditions were programmed as follows: ramp to 120° C. under Ar (flow rate: 1.1 L/min) in 1 hr, hold at 120° C. for 48 hr, then cool back to room temperature in 4 hr, switch the atmosphere into $H_2$ (flow rate: 4.2 L/min), ramp to 500° C. in 2 hr, calcine the substrate at 500° C. for 12 hr, and finally cool down to room temperature over 6 hr.

Atomic force microscope (AFM) measurements were performed on a Dimension Icon (Bruker) (or equivalent) to obtain 3D profiles of the patterns. Images were processed in Nanoscope Analysis 1.5. Confocal images were taken with a Zeiss LSM 800 Confocal Microscope (or equivalent). Images were processed with ImageJ and Zen Blue. Maximum intensity projections of confocal stacks were generated for each tile. Tiles were stitched with vignette corrections. Intensity plots were created from 500 pixel moving averages.

X-Ray fluorescence (XRF) data was collected at sector 5 BMD of the Advanced Photon Source. Fluorescence spectra were collected at an incident energy of 24.8 keV using two four-element Vortex ME-4 silicon drift diode detectors (or equivalent). The sample was placed in a glancing-incidence geometry with respect to the X-ray beam, at an angle of about 0.1°. A horizontal slit size of 3 mm was used and the sample translated in order to probe the gradient at various points on the sample. The vertical slit size was adjusted according to footprint calculation, such that the entire sample length would be measured, in order to both maximize fluorescence counts from the elements of interest and achieve a global representation of the gradient.

Example 1

The radial spray distribution of an ink composition was investigated at distances 5, 10, 15, and 20 cm from the surface of a paper substrate. A commercially available airbrush (e.g., a Harder Steenbeck Infinity CR plus airbrush with 0.15 mm needles and an Iwata Power Jet Pro IS-975 dual piston compressor at 20 PSI airflow, or equivalent) was loaded with aqueous ink composed of 20 millimolar rhodamine 6G and 1.2 millimolar poly(2-vinyl pyridine-b-ethylene oxide) (P2VP-b-PEO) and sprayed with an air flow pressure of 20 psi. The choice of a colored ink enabled the evaluation of the spray scatter from a scanned grayscale image.

Quantitative evaluation of this distribution was done by examining the intensity of the image in a line across the center of the image, which shows a linear full width half max (FWHM) of radial spray distribution 0.27. With this trend it was determined that a linear compositional gradient was scalable based on the size of the polymer pen array. In particular, to provide a 85% to 15% linear gradient on a 1.5 cm by 1.5 cm polymer pen array the air brush should be positioned about 20 cm from the surface of the target and when dual spray-applicators are used, the spray applicators should be positioned about 5 cm from each other. Thus, example 1 demonstrates it is possible to tailor the airbrush separation between both a first and a second airbrush and a polymer pen array based on the size of the polymer pen array to provide a linear gradient.

Example 2

A polymer pen lithographic tip array was inked with a mixture of inks. Two aqueous inks were synthesized, both consisting of 5 mg/ml P2VP-b-PEO and 10 mg/ml of a fluorophore (Rhodamine 6G or Alexa Fluor 647). The peak emission wavelengths of the two fluorophores were different (i.e. 566 nm and 647 nm, respectively). The two inks were simultaneously sprayed, each aimed at a different (and opposing) edge of the polymer pen array. The solutions were then allowed to completely dry and the process was repeated a total of three times to ensure uniformity of the gradient across the array. Once the array was completely dried, optical microscopy was used to characterize the ink distribution in the vicinity of the pens. Dark field (FIG. 3b) and Fluorescence (FIG. 3c) microscopy revealed a uniform ring of ink around a pen in the center of the array that had been exposed to both inks, demonstrating both uniform mixing and capillary effects during drying which result in the ink being localized around the pen.

The dual-spray coated pen array was imaged by scanning a fluorescence optical microscope across the center of the array while taking images of both fluorescence channels sequentially in each position (FIG. 4a). The counter propagating changes in fluorescence contrast indicate that the spray coating was indeed localized to either side of the array as a clear contrast change form high to background is observed starting from where each ink as sprayed and moving to the other side. Images were automatically stitched together via photomerge (Photoshop—Adobe) and converted into a 32-bit grayscale (ImageJ—Make). The whole image was vertically averaged to construct a profile plot of fluorescence intensity (FIG. 4b). The fluorescent intensity of each species was fit to a line, demonstrating the potential for dual spray coating to generate linear gradients of ink composition on polymer pen arrays.

Example 3

A dual spray coated pen array was used to pattern a compositional gradient on a silicon substrate. A PPL tip array was spray-coated with two inks, both inks having 5 mg/ml P2VP-b-PEO and one ink further including 10 mg/ml rhodamine 6G to offer fluorescent contrast. Prior to patterning, the pen array and patterning instrument were held at 100% relative humidity (RH) for 30 min to ensure that the ink was hydrated. Subsequently, the array was used to print a 25×25 array of dot features on a silicon wafer that had been vapor coated with hexamethyldisilazane to render it hydrophobic (FIG. 4c). Given that this pen array contained 126×126 pens, the final pattern was composed of nearly 10 million discrete polymer features. Large-scale fluorescence images were reconstructed, which clearly showed a macroscopic gradient in fluorescence across the patterned surface (FIG. 4a). Indeed, the average fluorescence intensity is well described by a linear gradient across the entire patterned surface (FIG. 4b).

Example 4

Metal-loaded block copolymers were provided on a silicon wafer substrate using a dual spray coated PPL tip array. It is known that the vinyl pyridine groups in P2VP-b-PEO will coordinate to metal ions and facilitate their transport from an ink to a substrate surface; this process is the foundation of scanning probe block copolymer lithography (SPBCL) in which these patterned metals are then annealed in order to synthesize metal nanoparticles in a site specific manner. Thus, a pen array was dual spray-coated with spray guns with aqueous solutions of P2VP-b-PEO, one including 18.75 mM auric acid and the other including 18.75 mM sodium tetrachloropalladate. Subsequently, the pen array was used to pattern on a HMDS-coated silicon wafer. The resulting features were characterized using XRF, which allowed for the calculation of the local ratio of Au to Pd in sections across the array (FIG. 8b). The fraction of Au to total Au and Pd varied from 9% to 88% gold relative to palladium across the substrate. Thus, example 4 demonstrates that dual spray coating is an effective technique for preparing PPL arrays inked with compositional gradients and useful for patterning on substrates to provided combinatorial libraries of nanoparticles by SPBCL.

What is claimed is:

1. A method of inking a polymer pen lithography tip array ("PPL tip array"), comprising:
   applying an ink composition to a defined area of the PPL tip array using at least two spray applicators to deposit the ink composition as a non-uniform ink layer onto the PPL tip array.

2. The method of claim 1, wherein the non-uniform ink layer comprises a concentration gradient of an ink composition.

3. The method of claim 1, wherein the non-uniform ink layer comprises a compositional gradient of two or more ink compositions applied by the at least two spray applicators.

4. The method of claim 2, wherein the gradient comprises a linear gradient.

5. The method of claim 2, wherein the gradient comprises a non-linear gradient.

6. The method of claim 2, wherein the non-uniform ink layer comprises a linear gradient and a non-linear gradient.

7. The method of claim 1, wherein the non-uniform ink layer comprises a non-uniform quantity of ink applied across the array.

8. The method of claim 1, wherein the non-uniform ink layer comprises a compositional gradient of two or more ink compositions across a first dimension of the PPL array and an ink quantity gradient across a second dimension of the PPL array.

9. A method of depositing at least two ink compositions on a polymer pen lithography tip array ("PPL tip array"), comprising:
   applying a first ink composition to a first defined area of the PPL tip array using a first spray applicator; and
   applying a second ink composition to a second defined area of the PPL tip array using a second spray applicator, thereby providing a mixture of ink compositions on the PPL tip array.

10. The method of claim 9, wherein the first defined area and the second defined area are separate.

11. The method of claim 9, wherein the first defined area and the second defined area overlap.

12. The method of claim 9, wherein the mixture of ink compositions on the PPL tip array comprises a non-uniform ink layer.

13. The method of claim 12, wherein the non-uniform ink layer comprises an ink compositional gradient.

14. The method of claim 13, wherein the gradient comprises a linear gradient.

15. The method of claim 13, wherein the gradient comprises a non-linear gradient.

16. The method of claim 13, wherein the non-uniform ink layer comprises a linear gradient and a non-linear gradient.

17. The method of claim 9, wherein the first composition and second composition are applied concurrently.

18. The method of claim 12, wherein the non-uniform ink layer comprises a compositional gradient of the first and second ink compositions across a first dimension of the PPL array and an ink quantity gradient across a second dimension of the PPL array.

19. A method of scaling a linear ink compositional gradient provided by at least two spray applicators to a polymer pen lithography tip array ("PPL tip array") having a length, L, comprising:
- positioning the at least two spray applicators at a distance of about 5.0 L to about 8.0 L relative to the surface of the PPL tip array;
- positioning the at least two spray applicators at a distance of about 0.5 L to about 3.0 L relative to each other; and
- applying an ink composition to the PPL tip array from the at least two spray applicators.

20. The method of claim 19, wherein the spray applicators are positioned at a distance of about 6.20 L to about 6.30 L relative to the surface of the PPL tip array.

* * * * *